(12) United States Patent
Shinojima

(10) Patent No.: US 7,557,451 B2
(45) Date of Patent: Jul. 7, 2009

(54) ELECTRO-OPTICAL DEVICE AND ELECTRONIC APPARATUS

(75) Inventor: Kazumoto Shinojima, Toyoshina (JP)

(73) Assignee: Seiko Epson Corporation (JP)

( * ) Notice: Subject to any disclaimer, the term of this patent is extended or adjusted under 35 U.S.C. 154(b) by 402 days.

(21) Appl. No.: 11/244,192

(22) Filed: Oct. 5, 2005

(65) Prior Publication Data

US 2006/0097364 A1    May 11, 2006

(30) Foreign Application Priority Data

Nov. 5, 2004    (JP)    ............................. 2004-321618

(51) Int. Cl.
*H01L 23/52*    (2006.01)
*H01L 23/48*    (2006.01)
*H01L 29/40*    (2006.01)

(52) U.S. Cl. .............................. 257/776; 257/E33.055; 257/666; 257/678; 257/773; 349/69; 349/150; 349/151; 438/107; 438/149; 174/260

(58) Field of Classification Search ................. 257/678, 257/666, 776, E33.055, E21.514, 786, 773, 257/72, 59; 349/69, 149, 151, 80, 102, 205, 349/150; 174/260; 438/107, 149, 464; 361/760–766, 361/772
See application file for complete search history.

(56) References Cited

U.S. PATENT DOCUMENTS

| | | | |
|---|---|---|---|
| 5,847,783 A * | 12/1998 | Hiramoto et al. | 349/69 |
| 6,086,441 A * | 7/2000 | Akiguchi et al. | 445/24 |
| 6,486,412 B2 * | 11/2002 | Kato | 174/260 |
| 6,507,384 B1 * | 1/2003 | Endo et al. | 349/149 |
| 6,771,332 B2 | 8/2004 | Yamada | 349/62 |
| 2006/0227981 A1 | 10/2006 | Miyata | 381/124 |

FOREIGN PATENT DOCUMENTS

| | | |
|---|---|---|
| JP | 08-130352 | 5/1996 |
| JP | 2000-227605 | 8/2000 |
| JP | 2000-250031 | 9/2000 |
| JP | 2000-267590 | 9/2000 |
| JP | 2002-270985 | 9/2002 |
| JP | 2003-114433 | 4/2003 |
| JP | 2004-133108 | 4/2004 |
| JP | 2004-177876 | 6/2004 |
| JP | 2004-258060 | 9/2004 |
| KR | 2003-0037167 | 5/2003 |
| WO | WO 2004/023199 | 3/2004 |

OTHER PUBLICATIONS

Communication from Korean Patent Office regarding counterpart application, May 12, 2003.

* cited by examiner

*Primary Examiner*—Chris C. Chu
(74) *Attorney, Agent, or Firm*—Harness, Dickey & Pierce, P.L.C.

(57) ABSTRACT

An electro-optical device includes a substrate that holds an electro-optical material; and a flexible substrate that is connected to the substrate. The flexible substrate has a first connecting portion that is arranged on one surface of the substrate; and a second connecting portion that is arranged on the other surface of the substrate.

13 Claims, 14 Drawing Sheets

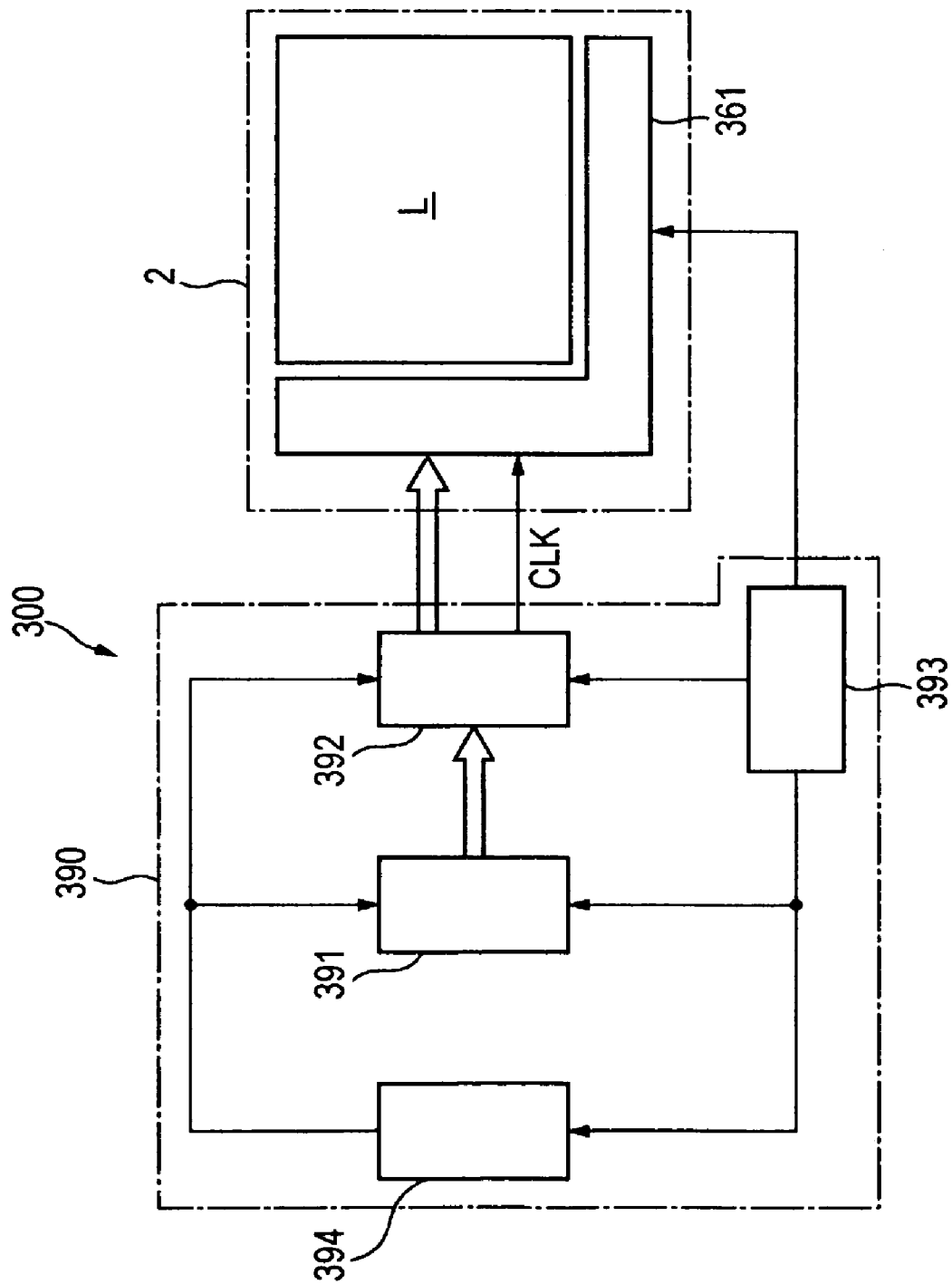

ELECTRO-OPTICAL DEVICE AND ELECTRONIC APPARATUS

BACKGROUND

1. Technical Field

The present invention relates to an electro-optical device used for a personal computer or a cellular phone and to an electronic apparatus using the same.

2. Related Art

In recent years, electro-optical devices, such as liquid crystal display devices, have come into widespread use as display devices of electronic apparatuses, such as a personal computer and a cellular phone. For example, in general, a transmissive or reflective liquid crystal display device has a structure in which a flexible substrate is connected to a liquid crystal panel, a light source, such as an LED (light emitting diode), is mounted on a portion of the flexible substrate opposite to the liquid crystal panel, and the flexible substrate is bent to arrange the light source on a light receiving surface of an optical waveguide.

However, in this case, there is a fear that the light source, such as an LED, will be detached from the light receiving surface of the optical waveguide by bending stress of the flexible substrate. In addition, in order to connect a connector of the flexible substrate to an external device on a surface of a liquid crystal panel opposite to a display surface, or to accommodate the flexible substrate, the flexible substrate should be bent to be adhered to the liquid crystal display panel or to members arranged on the rear surface of the liquid crystal panel. In this case, the flexible substrate may be detached therefrom by bending stress thereof.

Therefore, in order to prevent the positional deviation of the light source, such as an LED, or the detachment of the flexible substrate, a flexible substrate that has a fourth region for connecting a second region where a light source of the flexible substrate is arranged and a third region opposite to the second region has been suggested (for example, see JP-A-2004-133108 (paragraph [0048] and FIG. 4)).

However, according to the above-mentioned flexible substrate, when the flexible substrate is bent to be arranged on a surface of a liquid crystal panel opposite to a display surface, the thickness of a liquid crystal display device increases by a thickness corresponding to the bent portion of the flexible substrate. In addition, the flexible substrate should be bent in order to arrange the light source on the light receiving surface of the optical waveguide, which causes the length of the flexible substrate to be larger. Thus, this structure has a problem in that a reduction in the size and thickness of an electro-optical device is not achieved. Further, since the bent region is narrow, it is difficult to secure a sufficient area to mount wiring lines and electronic components. In addition, in order to secure a sufficient area, it is necessary to increase the size of the flexible substrate.

Furthermore, this structure causes weak bonding stress of the flexible substrate, but strong stress may occur according to the width of the bent portion.

SUMMARY

An advantage of some aspects of the invention is that it provides an electro-optical device and an electronic apparatus using the same, capable of reducing the size and thickness, of improving display quality by raising the arrangement accuracy of components, and of reducing the number of components by improving commonality of components, resulting in a reduction in manufacturing costs.

According to an aspect of the invention, an electro-optical device includes a substrate that holds an electro-optical material; and a flexible substrate that is connected to the substrate. The flexible substrate has a first connecting portion that is arranged on one surface of the substrate; and a second connecting portion that is arranged on the other surface of the substrate.

Here, the term 'flexible substrate' means, for example, a flexible printed circuit (FPC) or tape automated bonding (TAB).

In this aspect of the invention, the flexible substrate has the first connecting portion arranged on one surface of the substrate and the second connecting portion arranged on the other surface of the substrate. Therefore, in the liquid crystal display device, the first connecting portion can be electrically connected to the liquid crystal driving IC, and the light source can be mounted on the second connecting portion, without bending the flexible substrate serving as a base substrate, which makes it possible to reduce the size and thickness of the liquid crystal display device.

Further, the first and second connecting portions are provided in one edge of the flexible substrate facing the substrate. Therefore, even when the liquid crystal panel is connected to a portion of the flexible substrate facing the substrate and the light source is mounted on another portion of the flexible substrate opposite to the substrate, it is possible to accurately position them.

Furthermore, it is not necessary to bend the flexible substrate to arrange the light source on the light receiving surface of the optical waveguide. Therefore, the positional deviation of the light source from the light receiving surface due to bending stress does not occur, and the arrangement accuracy of components can be easily improved, which makes it possible to improve display quality.

Moreover, in the above-described structure, it is preferable that the first and second connecting portions be formed on the same side of the substrate. According to this structure, the connection of the first and second connecting portions of the flexible substrate to the liquid crystal driving IC and the light source are performed on one side of the liquid crystal display device. Therefore, it is possible to effectively arrange the components, and thus to reduce the width of a liquid crystal display device, resulting in a reduction in the size thereof.

Further, in the above-mentioned structure, it is preferable that the second connecting portion protrude from the first connecting portion toward the substrate. According to this structure, even when the light source should be arranged at the inner side of the substrate from a connection position of the first connecting portion and the substrate, the light source can be mounted on the second connecting portion, and the second connecting portion can be arranged on the light receiving surface of the optical waveguide corresponding to the display surface. Therefore, the light source mounted on the second connecting portion can be accurately positioned on the light receiving surface, and thus it is possible to prevent brightness irregularity on the display surface caused by the positional deviation of the light source.

Furthermore, in the above-mentioned structure, it is preferable that the first connecting portion be formed by a region surrounded by a cut-out portion passing through the flexible substrate or a region surrounded by the cut-out portion and the edge of the flexible substrate, and that the second connecting portion be formed by a region arranged outside the cut-out portion so as to be erected from the first connecting portion. According to this structure, since the first connecting portion is formed by the cut-out portion passing through the flexible substrate, the second connecting portion is easily erected from the first connecting portion formed by the cut-out portion to be arranged at a different position from the first connecting portion, without bending the flexible substrate. Therefore, it is possible to reduce the size and thickness of a liquid crystal display device.

Further, in the above-mentioned structure, it is preferable that the cut-out portion be formed substantially in a 'U' shape so that the surrounded region is opposite to the substrate with the cut-out portion interposed therebetween. According to this structure, a tongue portion surrounded by the U-shaped cut-out portion is arranged on one surface of the substrate as the first connecting portion. In addition, a region the second connecting portion, arranged outside the cut-out portion is erected from the tongue portion, that is, the second connecting portion having the light source mounted thereon is elected therefrom, and the second connecting portion is arranged on the other surface of the substrate opposite to the surface on which the first connecting portion is arranged. Thus, this structure enables light to be accurately incident on the light receiving surface of the optical waveguide.

Further, since the second connecting portion is arranged outside the cut-out portion, it is possible to increase the width of the second connecting portion, and to mount a plurality of light sources, such as LEDs (light emitting diodes), in a line on the second connecting portion.

Furthermore, in the above-mentioned structure, it is preferable that the cut-out portion be formed substantially in an 'L' shape formed by cutting out the flexible substrate from one end side thereof toward the inside and then by further cutting out it at a right angle in a direction opposite to the substrate. According to this structure, the first connecting portion can be arranged closer to the liquid crystal panel, which makes it possible to reduce the size and thickness of a liquid crystal display device.

Moreover, in the above-mentioned structure, it is preferable that a plurality of first connecting portions be formed by cut-out portions continuously formed in an edge of the flexible substrate facing the substrate so as to pass through the flexible substrate. According to this structure, a plurality of rectangular portions having different lengths are formed by cutting out the edge of the flexible substrate facing the substrate toward the inside of the flexible substrate, and the rectangular portions serve as the first connecting portions and the second connecting portions. Thus, it is possible to arrange the first and second connecting portions on different surfaces, without bending the flexible substrate.

Further, the first and second connecting portions can be formed in the wide width range, and thus the degree of freedom in the design of the flexible substrate can be improved. Thus, the flexible substrate can be arranged on substrates of various types of liquid crystal display devices.

Furthermore, in the above-mentioned structure, it is preferable that the first connecting portion be formed by a region arranged outside the cut-out portion passing through the flexible substrate, and that the second connecting portion be formed by a region surrounded by the cut-out portion so as to be erected from the first connecting portion. According to this structure, the first connecting portion can be formed to have a width larger than that of the second connecting portion, which makes it possible to cope with a case in which the width of the flexible substrate should increase for electrical connection between terminals and the liquid crystal panel. As a result, the degree of freedom in the design of an electro-optical device is improved.

Further, in the above-mentioned structure, it is preferable that an external connection portion for electrical connection to an external device be provided at an edge of the flexible substrate opposite to the substrate. According to this structure, it is not necessary to provide additional branch portions, and thus the number of components is reduced. In addition, it is possible to prevent an increase in the size and thickness of an electro-optical device due to electrical connection between the flexible substrate and external devices.

Furthermore, in the above-mentioned structure, it is preferable that a light source be provided in the second connecting portion. According to this structure, it is possible to accurately arrange the light source mounted on the second connecting portion on the light receiving surface of the optical waveguide, without bending the flexible substrate, and thus to reduce the size and thickness of an electro-optical device.

In addition, it is not necessary to bend the flexible substrate to arrange the light source on the light receiving surface of the optical waveguide. Therefore, the positional deviation of the light source from the light receiving surface due to bending stress does not occur, and the arrangement accuracy of components can be easily improved, which makes it possible to improve display quality.

Moreover, it is preferable that the above-mentioned electro-optical device further include an optical member that guides light emitted from the light source to the substrate. In addition, preferably, the second connecting portion is adhered to at least a surface of the optical member facing the substrate such that the light from the light source is emitted to the optical member. According to this structure, the flexible substrate can be adhered to the optical member by using a space formed on the polarizing plate bonded to the outer surface of a glass substrate. Therefore, it is possible to reduce the size and thickness of an electro-optical device by effectively using the space which has not been used in the related art.

In addition, since it is not necessary to bend the flexible substrate to effectively use the space, it is possible prevent an increase in the size and thickness of an electro-optical device due to the bend of the flexible substrate. Further, the positional deviation of the light source due to the bending stress of the flexible substrate does not occur, and an increase in the number of components, such as fixing tapes, can be prevented.

Furthermore, it is preferable that the above-mentioned electro-optical device further include an adhesive sheet that is provided between the substrate and the optical member to adhere the optical member to the substrate. In addition, preferably, adhesion between the second connecting portion and the optical member is performed by the adhesive sheet. According to this structure, the flexible substrate can be adhered to the optical member by the adhesive sheet for adhering the optical member to the substrate. Thus, an additional adhesive member is not needed, and thus the number of components can be reduced, which makes it possible to reduce manufacturing costs.

Moreover, it is preferable that the above-mentioned electro-optical device further include a frame that protects the optical member. In addition, preferably, the light source comes into contact with a portion of the frame. According to this structure, it is possible to prevent the light source from being detached from the optical waveguide by bringing the light source into contact with the frame, and thus to improve display quality.

According to another aspect of the invention, an electronic apparatus includes the above-mentioned electro-optical device.

According to this aspect, since the electronic apparatus includes the electro-optical device capable of reducing the size and thickness, of raising arrangement accuracy of components, and of improving display quality, it is possible to provide a high-quality electronic apparatus having small size and thickness.

BRIEF DESCRIPTION OF THE DRAWINGS

The invention will be described with reference to the accompanying drawings, wherein like numbers reference like elements.

FIG. 24 is a block diagram schematically illustrating the structure of a display control system of an electronic apparatus according to a third embodiment.

DESCRIPTION OF EXEMPLARY EMBODIMENTS

Hereinafter, preferred embodiments of the invention will be described with reference to the accompanying drawings. In the following embodiments, a liquid crystal display device, specifically, a passive-matrix-type transflective liquid crystal display device, serving as an electro-optical device, and an electronic apparatus including the liquid crystal display device will be described, but the invention is not limited thereto.

First Embodiment

Figure 1:
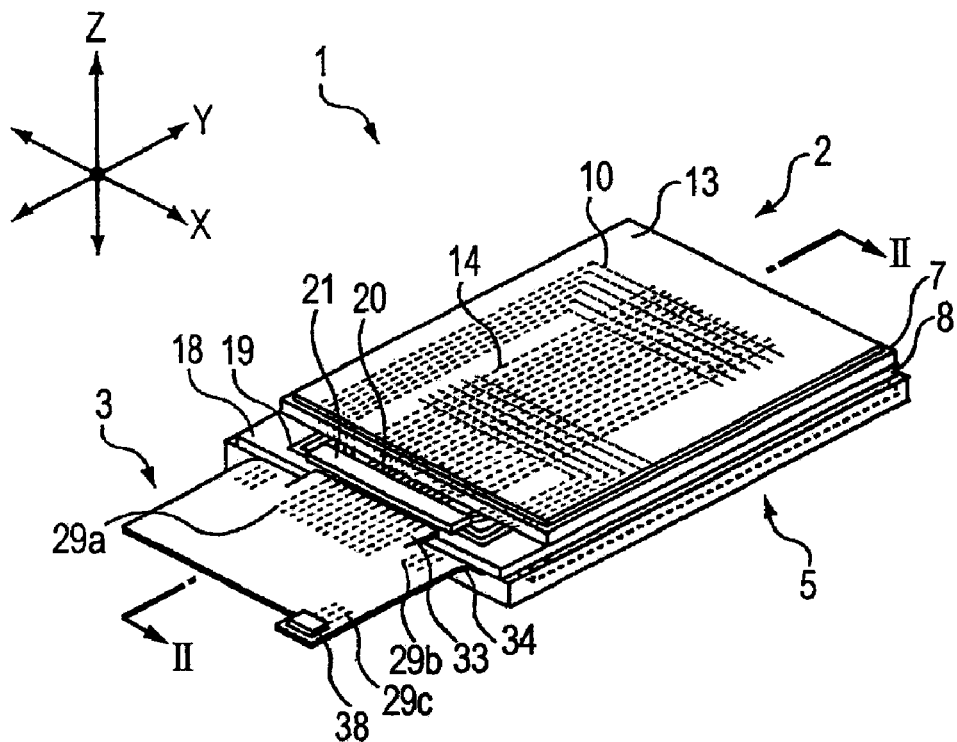
FIG. 1 is a perspective view schematically illustrating a liquid crystal display device according to a first embodiment of the invention.
Figure 2:
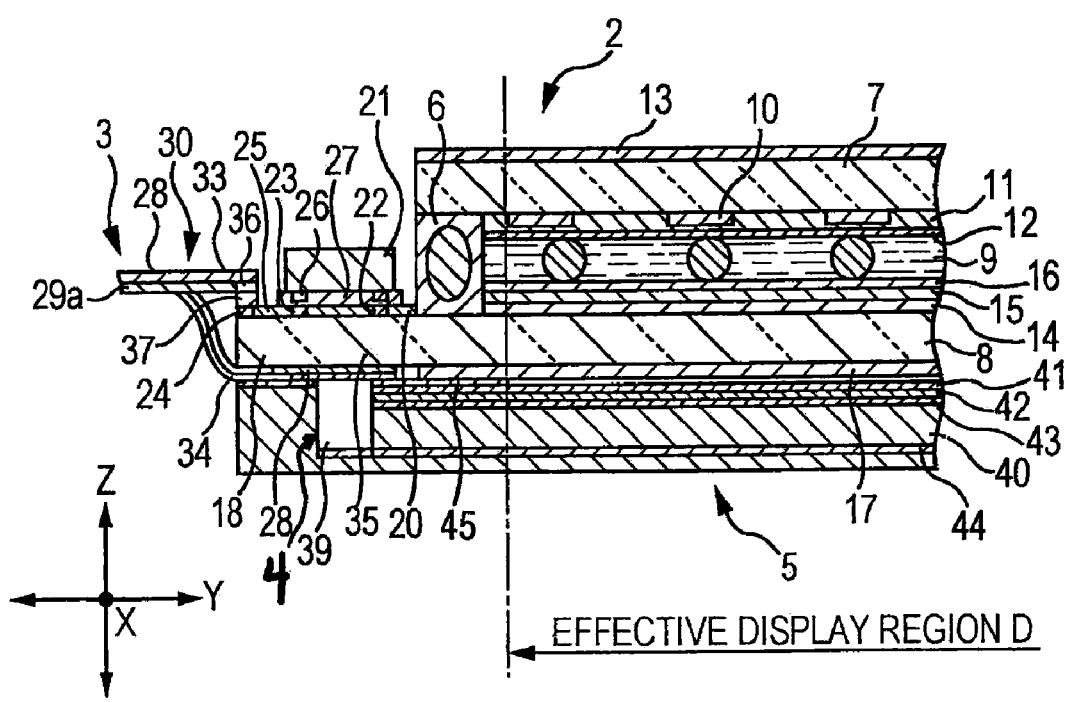
FIG. 2 is a cross-sectional view taken along the line II-II of FIG. 1.
Figure 3:
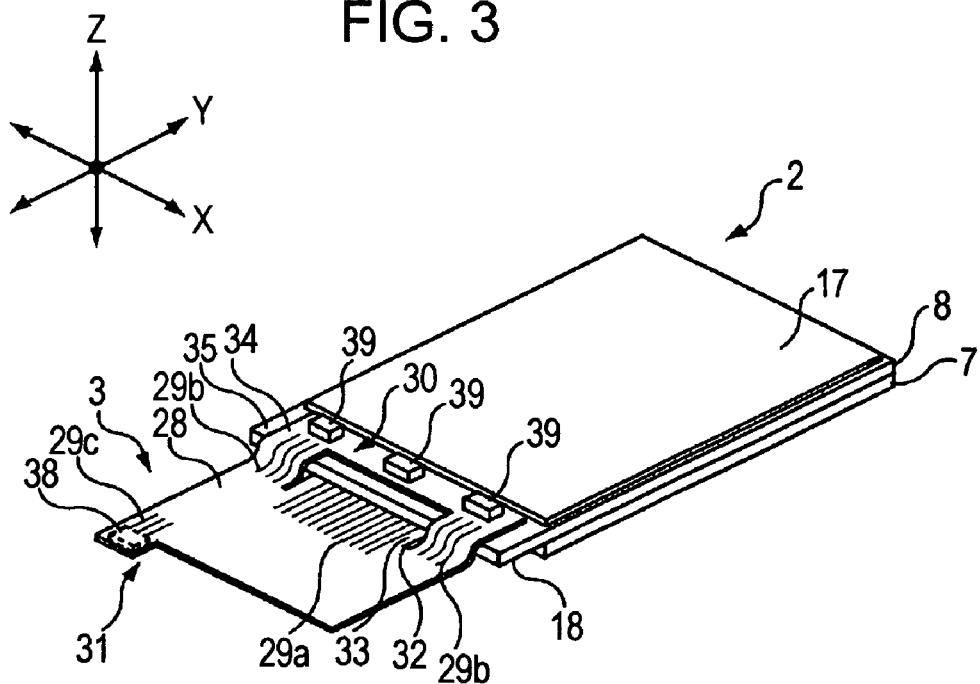
FIG. 3 is a bottom view schematically illustrating a liquid crystal panel and a flexible substrate according to the first embodiment.
Figure 4:
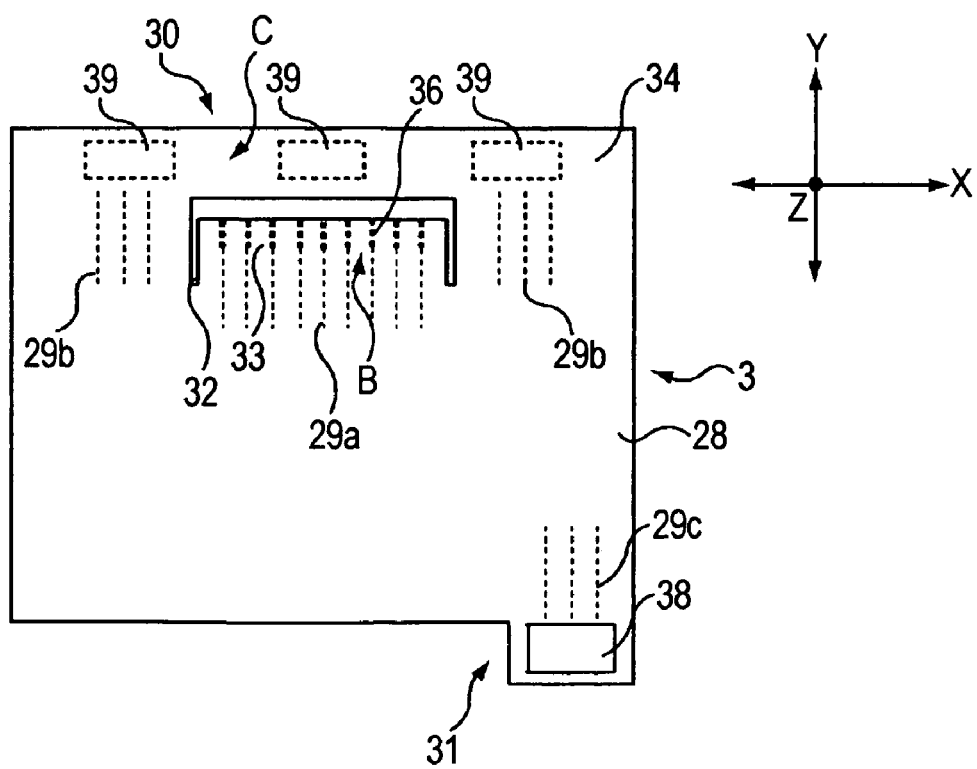
FIG. 4 is a plan view schematically illustrating the flexible substrate according to the first embodiment.
Figure 5:
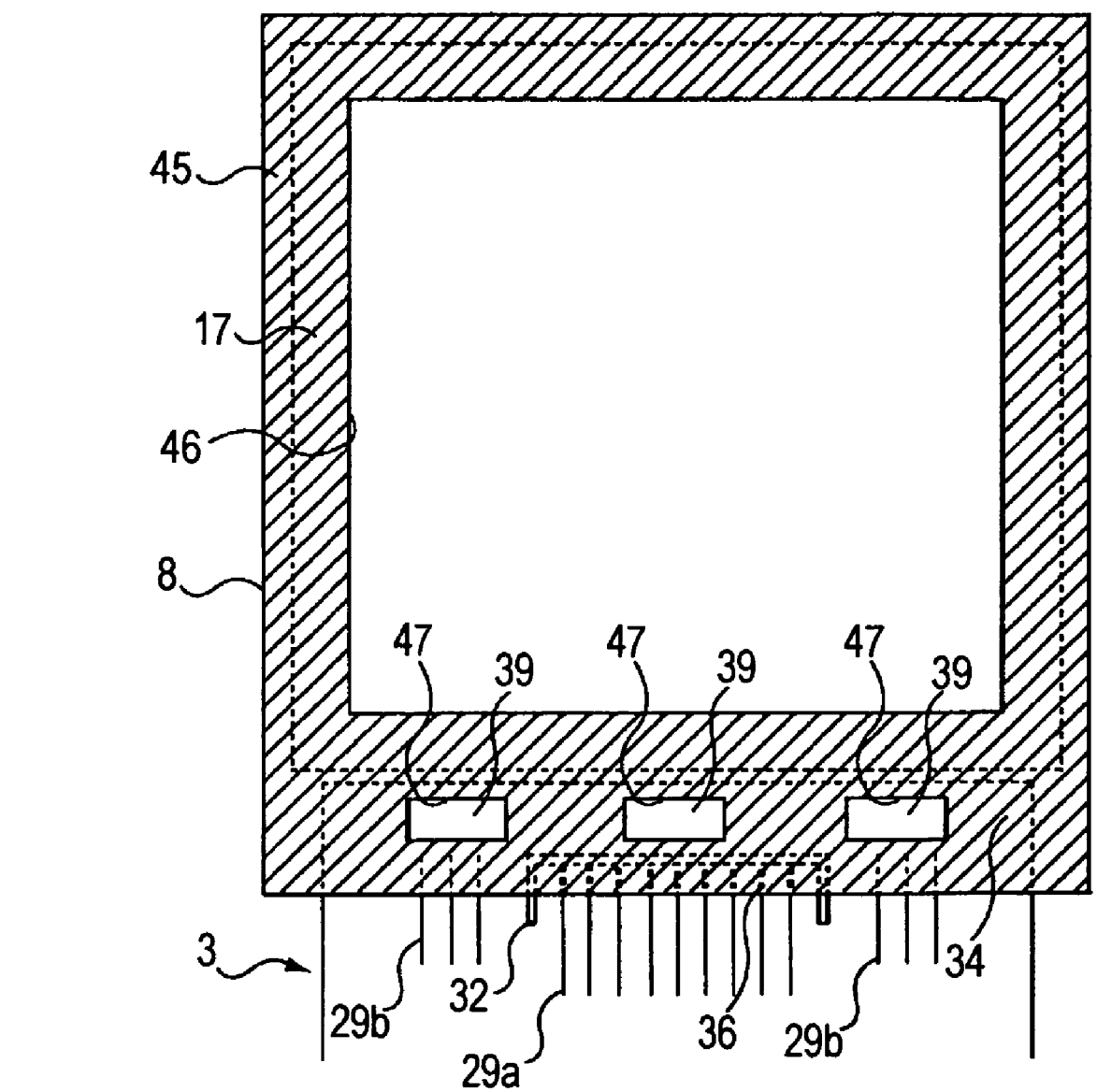
FIG. 5 is a view illustrating the bonded state of an adhesive sheet according to the first embodiment.
Figure 6:
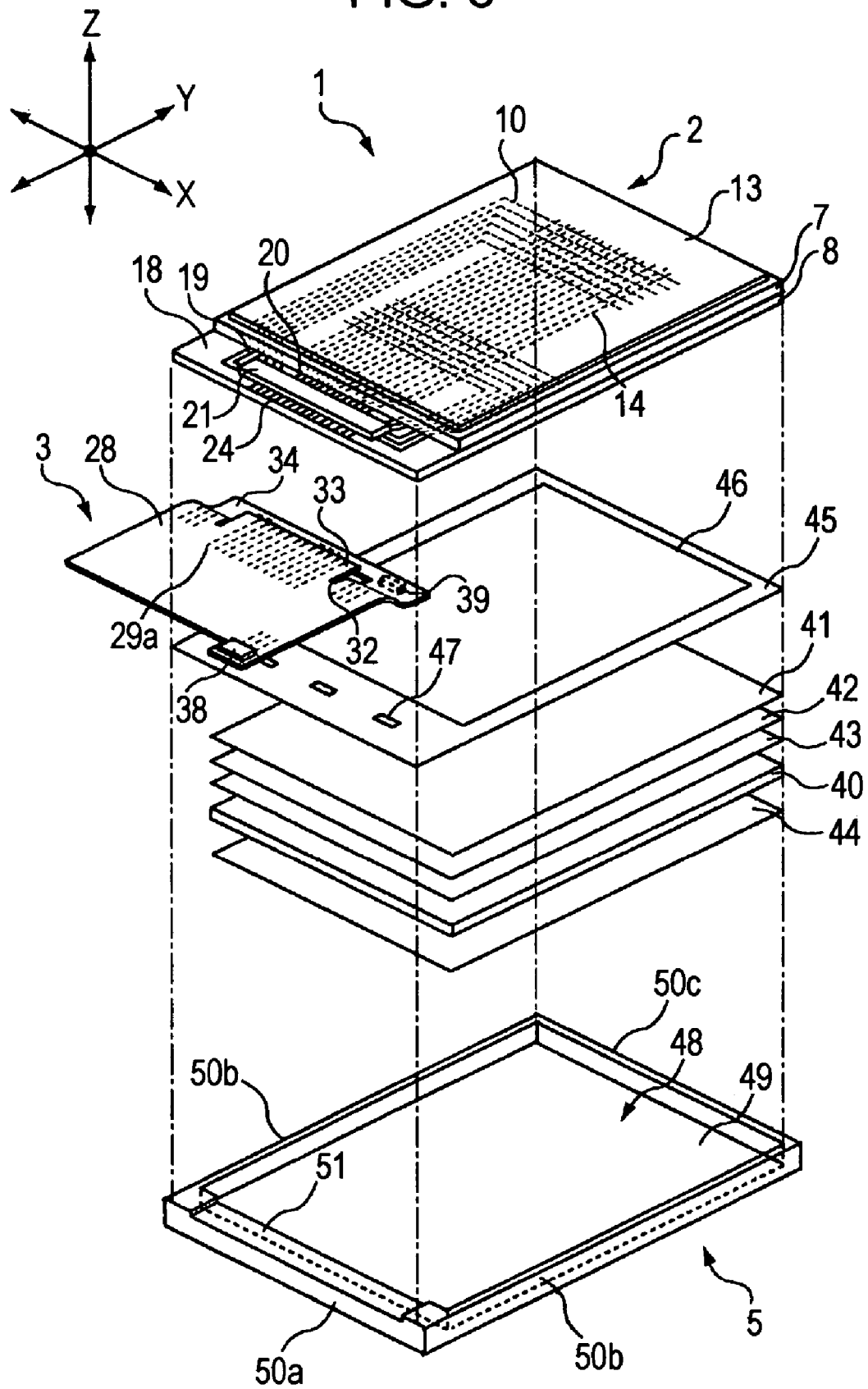
FIG. 6 is an exploded perspective view schematically illustrating the liquid crystal display device according to the first embodiment.

FIG. 1 is a perspective view schematically illustrating a liquid crystal display device according to a first embodiment of the invention. FIG. 2 is a cross-sectional view taken along the line II-II of FIG. 1 (a liquid crystal driving IC and a light source are not cut). FIG. 3 is a bottom view schematically illustrating a liquid crystal panel and a flexible substrate. FIG. 4 is a plan view schematically illustrating the flexible substrate. FIG. 5 is a plan view illustrating the bonded state of an adhesive sheet. FIG. 6 is an exploded perspective view schematically illustrating the liquid crystal display device.

Structure of Liquid Crystal Display Device

As shown in FIG. 1, a liquid crystal display device 1 includes, for example, a liquid crystal panel 2, a flexible substrate 3, serving as a base member, connected to the liquid crystal panel 2, an illuminating device 4 for emitting light to the liquid crystal panel 2, and a frame 5 for protecting the flexible substrate 3 and the illuminating device 4. In this structure, in addition to the frame 5, other components are additionally mounted to the liquid crystal display device 1, if necessary (not shown).

As shown in FIGS. 1 to 3, the liquid crystal panel 2 includes a pair of substrates bonded to each other by a sealing member 6, that is, a first substrate 7 and a second substrate 8, and STN (super twisted nematic) liquid crystal 9 serving as an electro-optical material injected to a space between the two substrates.

As shown in FIGS. 1 and 2, a plurality of common electrodes 10 are formed in a predetermined pattern on a surface of the first substrate 7 facing the liquid crystal, and an overcoat layer 11 is formed on surfaces of the common electrodes 10 facing the liquid crystal. In addition, an alignment film 12 is formed on a surface of the overcoat layer (facing the liquid crystal). Further, for example, a polarizing plate 13 is arranged on the other surface of the first substrate (opposite to the liquid crystal 9).

Meanwhile, as shown in FIGS. 1 and 2, a plurality of segment electrodes 14 are formed in a predetermined pattern on a surface of the second substrate 8 facing the liquid crystal, and an overcoat layer 15 is formed on surfaces of the segment electrodes 14 (facing the liquid crystal). In addition, an alignment film 16 is formed thereon. Further, for example, a polarizing plate 17 is arranged on the other surface of the second substrate 8 (opposite to the liquid crystal 9).

Furthermore, although not shown, for example, a base layer, a reflective layer, a colored layer, and a light shielding layer are formed on an inner surface of the first substrate 7 or the second substrate 8, if necessary.

As shown in FIGS. 1 and 2, the first and second substrates 7 and 8 are rectangular plate members made of a transmissive material, such as glass or synthetic resin. The second substrate 8 has a protruding portion 18 projecting from one side of the first rectangular substrate 7 to the outside (in the Y-axis direction of FIGS. 1 and 2).

As shown in FIGS. 1 and 2, a plurality of common electrodes 10 are made of a transparent conductive material, such as ITO (indium tin oxide), and are formed in strip shapes in one direction (in the X-axis direction of FIGS. 1 and 2).

Similar to the common electrodes 10, the segment electrodes 14 are made of a transparent conductive material, such as ITO, and are formed in strip shapes. However, as shown in FIGS. 1 and 2, the segment electrodes 14 are formed in the Y-axis direction of FIG. 1 so as to intersect the common electrodes 10. Intersections of the common electrodes 10 and the segment electrodes 14 serve as R (red), G (green), and B (blue) sub-pixels for displaying images.

Further, the overcoat layers 11 and 15 are made of, for example, a silicon oxide or a titanium oxide, or a mixture thereof. The alignment films 12 and 16 are made of, for example, polyimide-based resin. In addition, the polarizing plates 13 and 17 are composed of, for example, polymer thin polarizing films, and are respectively bonded to the outer surfaces of the two substrates.

As shown in FIGS. 1 and 2, the protruding portion 18 includes common electrode wiring lines 19 and segment electrode wiring lines 20 that extend from a region where the common electrodes 10 and the segment electrodes 14 are surrounded by the sealing member 6 to the protruding portion 18, and a liquid crystal driving IC (integrated circuit) 21 for supplying a liquid crystal driving current to the respective electrode wiring lines.

Further, the protruding portion 18 has a plurality of electrode terminals 22 provided in a mounting region of the second substrate 8 corresponding to a mounting surface of the liquid crystal driving IC 21 and a plurality of input terminals 23 for inputting a current from the flexible substrate 3 to the liquid crystal driving IC 21. The electrode terminals 22 are electrically connected to the common electrode wiring lines 19 and the segment electrode wiring lines 20.

Furthermore, the protruding portion 18 includes external connection terminals 24 to which a current is input from the flexible substrate 3 and input wiring lines 25 for supplying the current input from the outside to the input terminals 23.

Moreover, for example, the common electrode wiring lines 19 and the segment electrode wiring lines 20 are made of a transparent conductive material, such as ITO, similar to the common electrodes 10 and the segment electrodes 14.

When receiving various signals related to display images through the flexible substrate 3 and the input wiring lines 25, the liquid crystal driving IC 21 generates driving signals corresponding to the signals, and then the driving signals are supplied to the common electrode wiring lines 19 and the segment electrode wiring lines 20.

As shown in FIGS. 1 and 2, the liquid crystal driving IC 21 has a substantially rectangular shape in which long sides are arranged in the X-axis direction, and includes a plurality of bumps 26 to be electrically connected to the electrode terminals 22 and the input terminals 23 in the rear surface thereof which is mounted to the protruding portion 18. This electrical connection can be made by interposing an ACF (anisotropic conductive film) 27 between the bumps 26 and the electrode and input terminals 22 and 23.

Next, as shown in FIGS. 1 to 4 and FIG. 6, in the flexible substrate 3, wiring patterns 29 (29a, 29b, and 29c) are formed on a base substrate 28, and electronic components (not shown), such as capacitors and ICs, are mounted thereon. The base substrate 28 is a flexible film, and the wiring patterns 29 (29a, 29b, and 29c) are made of, for example, copper.

Further, as shown in FIG. 4, the flexible substrate 3 has a substantially rectangular shape, and includes a portion 30 arranged adjacent to the second substrate 8, which is shown in the upper side of FIG. 4, and a portion 31 arranged opposite to the second substrate 8, which is shown in the lower side of FIG. 4. The portion 30 has a cut-out portion 32 having a 'U' shape that is provided substantially at the center thereof so as to pass through the base substrate. The portion 30 includes a first connecting portion 33 formed by a substantially rectangular region B surrounded by the cut-out portion 32 and a second connecting portion 34 formed by a region arranged outside the cut-out portion 32.

For example, as shown in FIGS. 1 to 3 and FIG. 6, the second connecting portion 34 is erected from both ends of the cut-out portion 32 on the right and left sides of the first connecting portion 33 and is then placed on the surface of the second substrate 8 of the liquid crystal panel 2 opposite to the liquid crystal (the side opposite to the display surface of the liquid crystal panel 2). Therefore, as shown in FIG. 3, the second connecting portion 34 is arranged on an externally projecting portion 35 of the second substrate 8 that projects from the polarizing plate 17.

Furthermore, as shown in FIGS. 1, 2, and 4, a plurality of connecting terminals 36 electrically connected to the wiring pattern 29a is provided in the vicinity of the edge of the first connecting portion 33 that is formed by the region surrounded by the cut-out portion 32. The connecting terminals 36 are electrically connected to the external connection terminals 24 of the liquid crystal panel 2 through an external connection ACF 37. In this way, it is possible to supply various signals related to display images from the flexible substrate 3 to the liquid crystal driving IC 21 through the input wiring lines 25.

As shown in FIGS. 1, 3, and 4, the portion 31 has a protruding part, and a connector 38, serving as an external connection portion, is provided in the protruding part, which is an end part. In addition, the connector 38 is electrically connected to the wiring pattern 29b formed on the base substrate 28. Of course, the connector 38 may be provided in parts of the portion 31 other than the projecting part, and it may be provided at side edge portions. In this way, it is possible to achieve electrical connection with a high degree of efficiency.

As shown in FIGS. 2, 3, 4, and 6, the illuminating device 4 includes light sources 39 for emitting light toward the liquid crystal panel 2, an optical waveguide 40 serving as an optical member for guiding the light emitted from the light sources 39 to the liquid crystal panel 2, two prism sheets 41 and 42, a diffusing sheet 43, a reflective sheet 44, and an adhesive sheet 45 serving as an adhesive member for fixing the optical member to the liquid crystal panel 2.

For example, LEDs are used as the light sources 39. As shown in FIGS. 2 and 3, three LEDs are mounted at predetermined intervals in the X-axis direction on a surface of the second connecting portion 34 opposite to the externally protruding portion of the second substrate 8.

As shown in FIG. 2, a portion of the base substrate between the respective light sources 39 and the edge of the second connecting portion 34 of the flexible substrate 3 is adhered to a light-source-side end portion of the prism sheet 41, serving as an optical member, which is arranged on the second substrate 8, by the adhesive sheet 45. In this way, as shown in FIG. 2, the light sources 39 are accurately positioned on a light receiving surface of the optical waveguide 40, and thus light emitted from the light sources can be properly incident on the optical waveguide 40.

Further, as shown in FIGS. 2 and 6, the optical waveguide 40 has a substantially rectangular shape, and makes light emitted from the light sources 39 incident on the entire surface of the diffusing sheet 43. The prism sheets 41 and 42 improve the brightness of light emitted from the optical waveguide 40.

In addition, the adhesive sheet 45 is, for example, a double-sided adhesive tape having a substantially rectangular shape, as shown in FIG. 5. The adhesive sheet 45 is adhered to the polarizing plate 17 and a surface of the second connecting portion 34 of the flexible substrate 3 opposite to the externally protruding portion on the second substrate 8, with one adhesive surface thereof facing them.

As shown in FIG. 5, the edge of the adhesive sheet 45 is aligned with the edge of the second substrate 8, and a light-emitting opening 46 having a substantially rectangular shape for making light emitted from the prism sheet 41 incident on the polarizing plate 17 is formed in the adhesive sheet 45 at a position slightly leaning from the center toward an edge (an upper side in FIG. 5) thereof.

Further, three light source openings 47 are formed in a line along the X-axis direction on the lower side of the light-emitting opening 46 to overlap the three light sources 39, as shown in FIG. 5, such that the three light sources 39 mounted on the second connecting portion 34 of the flexible substrate 3 can be fitted thereinto.

Furthermore, the prism sheet 41, serving as an optical member, is adhered to a portion of the adhesive surface of the adhesive sheet 45 opposite to the liquid crystal panel 2, which corresponds to the polarizing plate 17, and an end surface of the frame 5 facing the second substrate is adhered to a portion of the adhesive surface of the adhesive sheet 45 positioned at the lower side of the light source openings 47 in FIG. 5.

As shown in FIGS. 1, 2, and 6, the frame 5 has a substantially box-shaped concave portion 48 whose one surface facing the liquid crystal panel is opened, and the optical waveguide 40, serving as an optical member, is arranged in the concave portion 48. More specifically, an inner bottom surface 49 and a reflective sheet 44 (not shown), serving as an optical member, of the concave portion 48 are bonded to each other by, for example, an adhesive.

Further, as shown in FIG. 6, the frame 5 has, at four corners of the inner bottom surface 49, a side wall 50a to which the surface of the second connecting portion 34 of the flexible substrate 3 opposite to the display surface (the side facing the polarizing plate 13) of the liquid crystal panel 2 is inserted, side walls 50b arranged at both sides of the side wall 50a, and a side wall 50c opposite to the side wall 50a.

As shown in FIG. 6, a sidewall concave portion 51 is formed substantially at the center of the side wall 50a so as to be recessed from the upper end surface thereof by about the thickness of the flexible substrate 3. In addition, as shown in FIG. 2, a portion of the adhesive sheet 45 is adhered to a portion of the side wall 50a and the sidewall concave portion 51. In this way, the flexible substrate 3 is fixed to the frame 5.

As shown in FIG. 2 and 6, when the frame 5 is arranged such that the light sources 39 and the optical waveguide 40, serving as an optical member, are accommodated in the concave portion 48 of the frame 5, inner surfaces of the light sources 39 come into contact with the inner sidewall of the side wall 50a of the sidewall concave portion 51, which makes it possible to prevent light emission surfaces of the light sources from being detached from the light receiving surface of the optical waveguide 40 in the Y direction.

However, in this embodiment, the second connecting portion 34 of the flexible substrate 3 is arranged on the surface of the second substrate 8 of the liquid crystal panel 2 opposite to the liquid crystal, but the invention is not limited to this structure. For example, the second connecting portion 34 may be only arranged on the externally protruding portion 35 so as not to be covered with the frame 5 and not to be interposed between members.

Manufacturing Method of Liquid Crystal Display Device

Next, a method of manufacturing the liquid crystal display device 1 having the above-mentioned structure will be described, centered on an assembly process of the flexible substrate 3, the liquid crystal panel 2, the illuminating device 4, and the frame 5.

Figure 7:
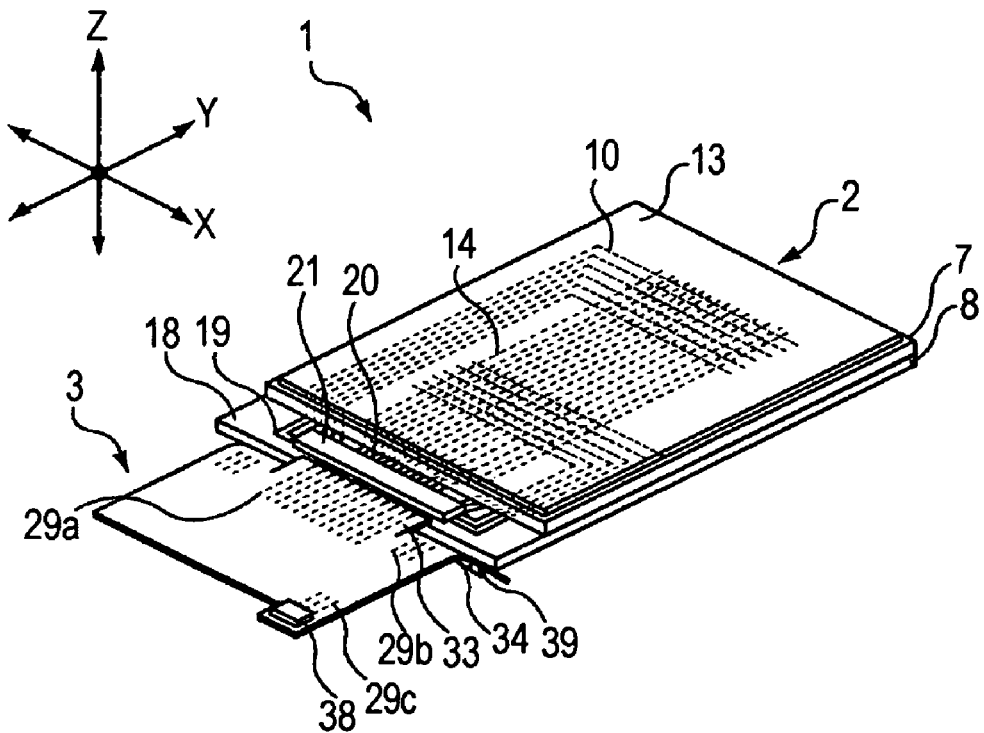
FIG. 7 is a view illustrating a connection of the flexible substrate and the liquid crystal panel.
Figure 8:
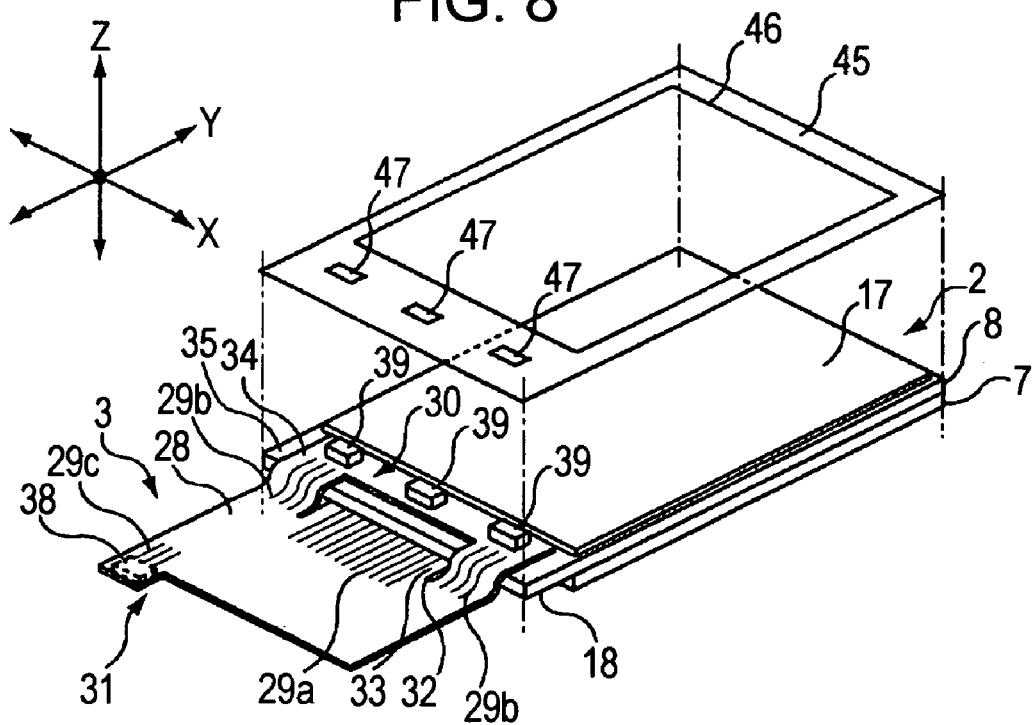
FIG. 8 is a view illustrating adhesion of the adhesive sheet to a polarizing plate and the flexible substrate.

FIG. 7 is a view illustrating a state in which the flexible substrate is connected to the liquid crystal panel, and FIG. 8 is a view illustrating a process of adhering the adhesive sheet to the polarizing plate and the flexible substrate.

First, the liquid crystal panel 2 and the optical waveguide 40, serving as an optical member, are manufactured by using a well-known method.

Next, as shown in FIG. 4, a film made of copper is formed on the base substrate 28 by, for example, a sputtering method, and the wiring patterns 29a, 29b, and 29c and a plurality of connecting terminals 36 are formed by, for example, a photolithography method. In addition, three light sources 39 are mounted on the surface of the second connecting portion 34 of the flexible substrate 3 opposite to the liquid crystal so as to be separated from each other at predetermined intervals. Then, the connector 38 is mounted on the protruding part of the portion 31 so as to be electrically connected to the wiring pattern 29c. In this structure, three light sources 39 are mounted, but the number of light sources is not limited thereto. For example, two or four light sources may be mounted. This structure can be applied to various types of liquid crystal display devices.

Then, the U-shaped cut-out portion 32 is formed substantially at the center of the flexible substrate 3, as shown in FIG. 4, such that the connecting terminals 36 are placed at the edge of the first connecting portion surrounded by the cut-out portion 32. In this way, the second connecting portion 34 is formed by the region C arranged outside the cut-out portion 32, and the three light sources 39 are arranged on the second connecting portion 34.

Subsequently, as shown in FIG. 7, the second connecting portion 34 of the flexible substrate 3 is erected from the first connecting portion 33 by using the cut-out portion 32, and is then placed on the surface of the externally protruding portion 35 opposite to the display surface of the liquid crystal panel 2. The external connection terminals 24 of the second substrate 8 of the liquid crystal panel 2 are electrically connected to the connecting terminals 36 formed on the first connecting portion 33 of the flexible substrate 3 through the external connection ACF 37 to connect the liquid crystal panel 2 and the flexible substrate 3.

Next, as shown in FIG. 8, the second connecting portion 34 of the flexible substrate 3 is arranged on the externally protruding portion 35 such that the light sources 39 mounted on the second connecting portion 34 are accurately disposed on the light receiving surface of the optical waveguide 40, and the adhesive sheet 45 is adhered to the second connecting portion 34 and the polarizing plate 17.

As shown in FIGS. 2 and 5, at that time, the light-emitting opening 46 of the adhesive sheet 45 substantially corresponds to an effective display region D of the liquid crystal panel 2, and the three light sources 39 are accurately fitted into the light source openings 47 of the adhesive sheet 45. In this way, the second connecting portion 34 of the flexible substrate 3 is fixed to a predetermined position where light emitted from the mounted light sources 39 is accurately incident on the optical waveguide 40.

Then, as shown in FIGS. 2 and 6, the prism sheets 41 and 42, the diffusing sheet 43, the optical waveguide 40, and the reflective sheet 44, which are optical members of the illuminating device 40, are arranged on the adhesive surface of the adhesive sheet 45 opposite to the polarizing plate 17, and the second connecting portion 34 is adhered to the surface of the prism sheet 41, serving as an optical member, facing the second substrate 8.

The frame 5 is arranged such that the illuminating device 4 is adhered to the flexible substrate 3 and the liquid crystal panel 2, and the light sources 39 and the optical waveguide 40, serving as an optical member, are accommodated in the concave portion 48 of the frame 5. At that time, as shown in FIGS. 2 and 6, a portion of the side wall 50*a* and the sidewall portion 51 of the frame 5 is adhered to the adhesive sheet 45, and the inner bottom surface 49 of the frame 5 is adhered to the reflective sheet 44, serving as an optical member, by, for example, a double-sided adhesive sheet.

Further, as shown in FIGS. 2 and 6, when the frame 5 is arranged such that the light sources 39 and the optical waveguide 40, serving as an optical member, are accommodated in the concave portion 48 of the frame 5, the side walls of the light sources 39 come into contact with the inner side walls of the side wall 50*a* of the sidewall concave portion 51, which makes it possible to prevent the light emission surfaces of the light sources from being detached from the light receiving surface of the optical waveguide 40 in the Y direction.

Furthermore, since the second connecting portion 34 of the flexible substrate 3 arranged in the frame 5 is accommodated in the sidewall concave portion 51 of the frame 5, an increase in the thickness of the liquid crystal display device 1 caused by the flexible substrate 3 is prevented, resulting in a reduction in the thickness of the liquid crystal display device 1.

The assembly process of the flexible substrate 3, the liquid crystal panel 2, the illuminating device 4, and the frame 5 is completed in this way.

Then, for example, an external circuit is electrically connected through the connector 38, and then a case is attached, thereby completing the liquid crystal display device 1 serving as an electro-optical device.

As such, according to this embodiment, the flexible substrate 3, which is a base member, has the first connecting portion 33 arranged on the protruding portion 18 of the second substrate 8, and the second connecting portion 34 arranged on the externally protruding portion 35 of the second substrate 8. Therefore, the first connecting portion 33 can be electrically connected to the liquid crystal driving IC 21, and the light sources 39 can be mounted on the second connecting portion 34, without bending the flexible substrate 3, which makes it possible to reduce the size and thickness of the liquid crystal display device 1.

Further, the flexible substrate 3 has the first and second connecting portions 33 and 34 on the sides of the first and second substrates. Therefore, even when the liquid crystal panel is connected to a side of the flexible substrate facing the first and second substrates and the light sources are arranged on another side of the flexible substrate opposite to the first and second substrates, it is possible to accurately position them.

Further, it is not necessary to bend the flexible substrate 3 to support the light sources 39 on the light receiving surface of the optical waveguide 40. Therefore, the light sources 39 do not deviate from the light receiving surface of the optical waveguide 40, and thus it is possible to easily improve the arrangement accuracy of components and display quality.

Furthermore, the arrangement of the first and second connecting portions 33 and 34 of the flexible substrate 3 with respect to the liquid crystal driving IC 21 is performed on the one side of the second substrate 8 of the liquid crystal panel 2. Therefore, it is possible to effectively arrange components, and to decrease the width of a liquid crystal display device, which results in a reduction in the size thereof.

Moreover, the second connecting portion 34 protrudes from the first connecting portion 33 toward the first and second substrates. Therefore, when the light sources 39 is needed to be arranged at the more inner side of the second substrate 8 than a connecting position between the first connecting portion 33 and the second substrate 8, the light sources 39 can be mounted to the second connecting portion 34, and the second connecting portion 34 can be arranged on the light receiving surface of the optical waveguide 40, so that the light sources 39 mounted on the second connecting portion 34 can be accurately arranged. As a result, it is possible to prevent brightness irregularity on the display surface due to the positional deviation of the light sources 39.

Further, the first connecting portion 33 is formed by the region B that is surrounded by the cut-out portion 32 passing through the flexible substrate 3, and the second connecting portion 34 is formed by the region C arranged outside the cut-out portion 32 so that it can be erected from the first connecting portion 33. Therefore, the second connecting portion 34 is easily erected from the first connecting portion 33 formed around the cut-out portion 32, without bending the flexible substrate 3, and arranged at a different position from the first connecting portion 33, which makes it possible to reduce the size and thickness of the liquid crystal display panel 1.

Furthermore, the cut-out portion 32 is formed substantially in a 'U' shape such that the region B surrounded by the cut-out portion 32 is an opposite side of the second substrate with respect to the cut-out portion 32. Therefore, a tongue-shaped portion, which is the region B surrounded by the cut-out portion 32, is arranged on the protruding portion 18, which is a part of one surface of the second substrate 8, as the first connecting portion 33. In addition, the region C arranged outside the cut-out portion 32 is erected from the tongue-shaped portion such that the second connecting portion 34 on which the light sources 39 are mounted are placed on the externally protruding portion 35, which is a part of the other surface of the second substrate 8. Thus, it is possible to make light incident on the light receiving surface of the optical waveguide 40.

Furthermore, since the second connecting portion 34 is an outside region of the cut-out portion 32, the end portion of the second connecting portion 34 can be widened, and thus a plurality of light sources, such as LEDs, can be arranged in a row on the second connecting portion.

Moreover, an optical member for guiding light emitted from the light sources 39 to the liquid crystal panel 2 is further provided, and the second connecting portion 34 is adhered to a surface of the optical member facing the second substrate such that the light from the light sources 39 is emitted to the optical member, for example, the optical waveguide 40. Therefore, the second connecting portion 34 of the flexible substrate 3 can be adhered to the optical member in a space formed by the polarizing plate adhered on the outer side of the second substrate 8. As a result, it is possible to reduce the size and thickness of the liquid crystal display device 1 by effectively using the space which has not been used in the related art.

Further, it is not necessary to bend the flexible substrate 3 when effectively using the space. Thus, it is possible to prevent an increase in the size and thickness of the liquid crystal display device 1.

Furthermore, the adhesive sheet 45 for adhering an optical member, for example, the prism sheet 41 to the second substrate is provided between the second substrate 8 and the optical member, and the second connecting portion 34 is adhered to the optical member by the adhesive sheet 45. Therefore, the second connecting portion 34 of the flexible substrate 3 is also adhered to the optical member by using the adhesive sheet 45 for adhering the optical member to the second substrate 8. Thus, an additional adhesive member is not needed, which results in a decrease in the number of components and manufacturing costs.

In addition, the light sources 39 come into contact with a portion of the frame 5. Therefore, it is possible to prevent the positional deviation between the light sources 39 and the optical waveguide 40 by bringing the light sources 39 into contact with the frame 5, and thus to improve the display quality of a liquid crystal display device.

Second Embodiment

Next, a liquid crystal display device according to a second embodiment of the invention will be described. In the second embodiment, the arrangement positions of the first and second connecting portions of the flexible substrate are reverse to those in the first embodiment, and COF (chip on film) is used, which is different from the first embodiment. Therefore, the following description centers on the different points. In addition, the same components as those in the first embodiment have the same reference numerals, and a description thereof will be omitted.

Figure 9:
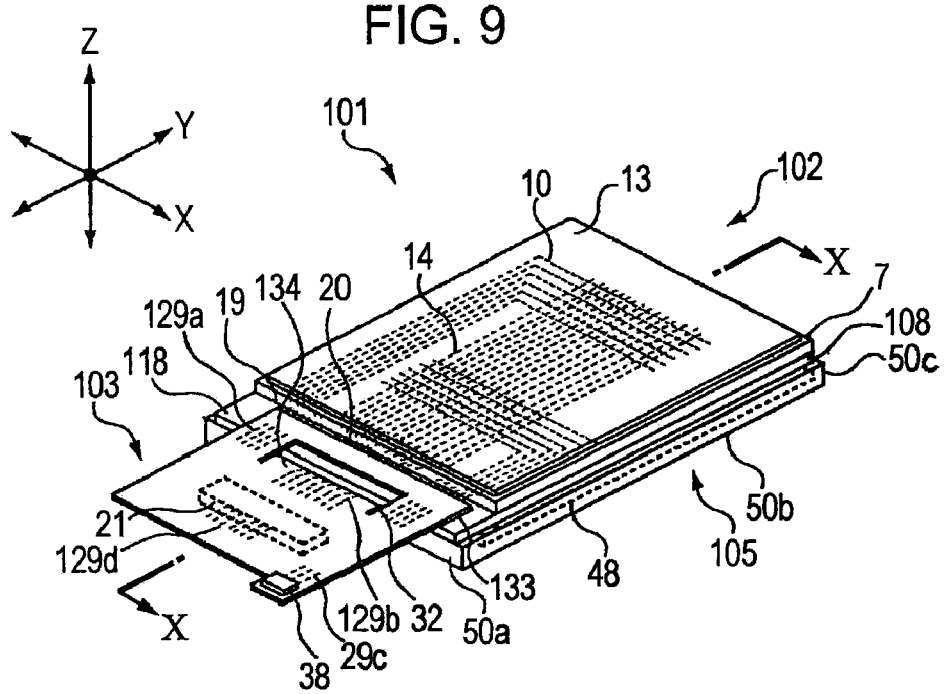
FIG. 9 is a perspective view schematically illustrating a liquid crystal display device according to a second embodiment of the invention.
Figure 10:
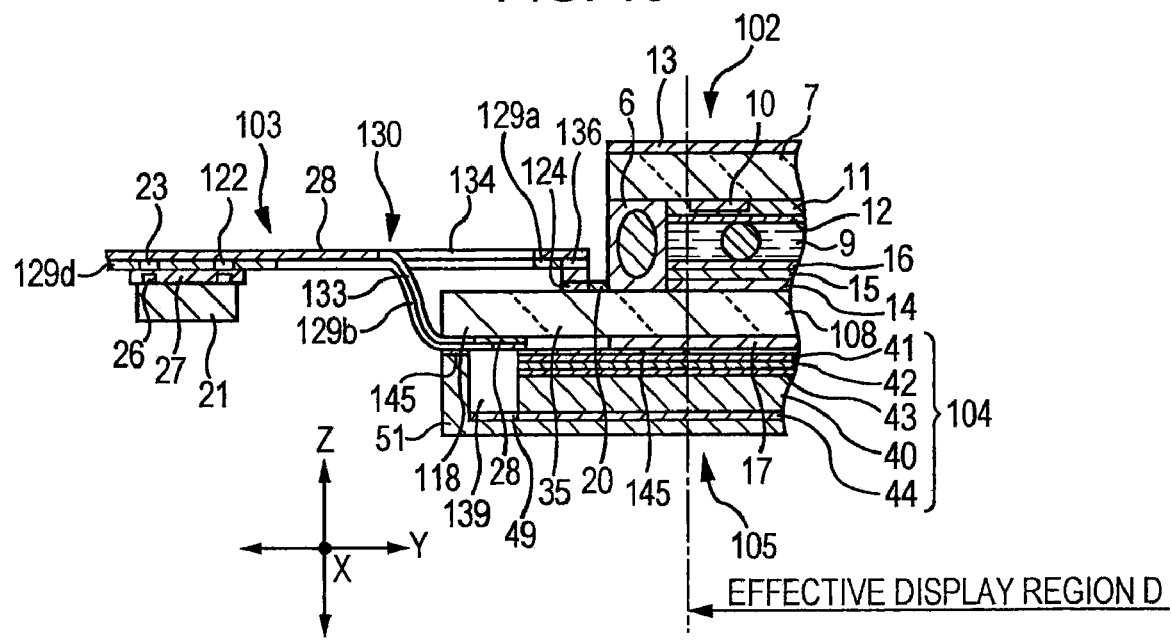
FIG. 10 is a cross-sectional view taken along the line X-X of FIG. 9 (a liquid crystal driving IC and a light source are not cut).
Figure 11:
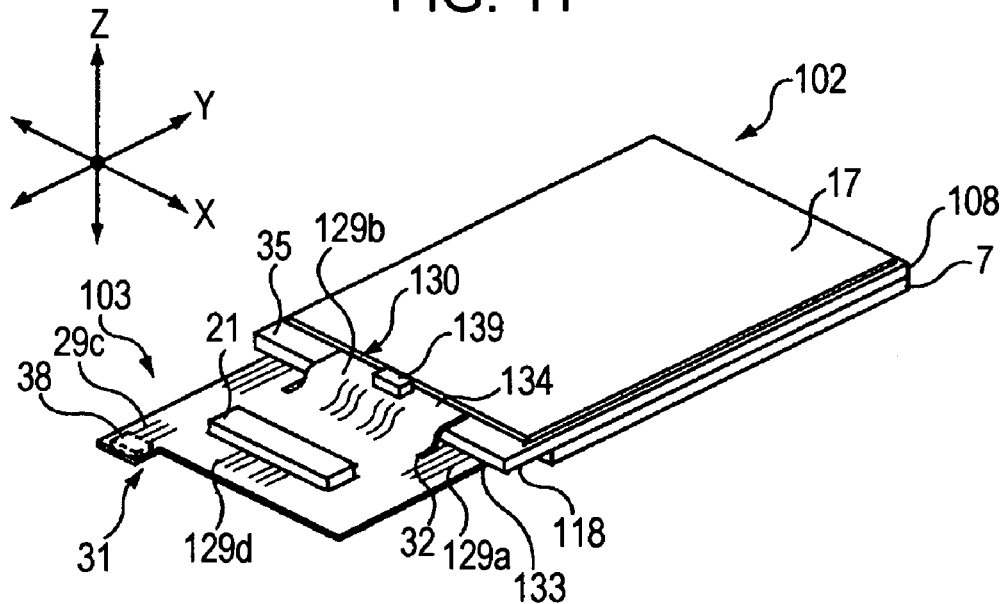
FIG. 11 is a bottom view schematically illustrating a liquid crystal panel and a flexible substrate according to the second embodiment.
Figure 12:
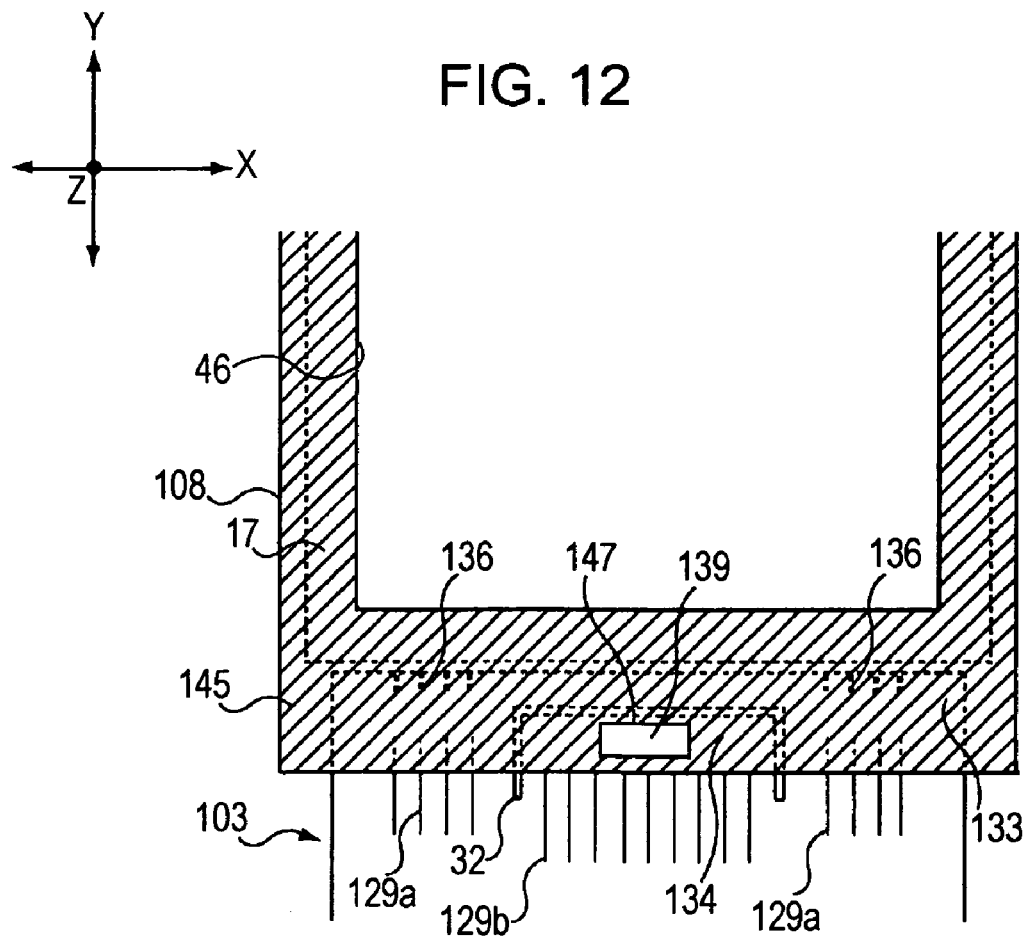
FIG. 12 is a view illustrating the bonded state of an adhesive sheet according to the second embodiment.

FIG. 9 is a perspective view schematically illustrating a liquid crystal display device according to the second embodiment of the invention. FIG. 10 is a cross-sectional view taken along the line X-X of FIG. 9 (a liquid crystal driving IC and a light source are not cut). FIG. 11 is a bottom view schematically illustrating a liquid crystal panel and a flexible substrate. FIG. 12 is a plan view illustrating the bonded state of an adhesive sheet.

Structure of Liquid Crystal Display Device

As shown in FIG. 9, a liquid crystal display device 101 includes, for example, a liquid crystal panel 102, a flexible substrate 103, serving as a base member, connected to the liquid crystal panel 102, an illuminating device 104 for emitting light to the liquid crystal panel 102, and a frame 5 for protecting the flexible substrate 103 and the illuminating device 104. In this structure, in addition to the frame 5, other components are additionally mounted to the liquid crystal display device 101, if necessary (not shown).

As shown in FIGS. 9 to 11, the liquid crystal panel 102 includes a pair of substrates bonded to each other by a sealing member 6, that is, a first substrate 7 and a second substrate 108, and STN (super twisted nematic) liquid crystal 9 serving as an electro-optical material injected to a space between the two substrates.

As shown in FIGS. 9 and 10, the first and second substrates 7 and 108 are rectangular plate members made of a transmissive material, such as glass or synthetic resin. The second substrate 108 has a protruding portion 118 projecting from one side of the first rectangular substrate 7 to the outside (in the Y-axis direction of FIGS. 9 and 10).

As shown in FIGS. 9 and 10, the protruding portion 118 includes common electrode wiring lines 19 and segment electrode wiring lines 20 that extend from a region where the common electrodes 10 and the segment electrodes 14 are surrounded by the sealing member 6 to the protruding portion 118, and external connection terminals 124 electrically connected to the respective wiring lines to receive a current from the flexible substrate 3.

Next, as shown in FIGS. 9 to 11, in the flexible substrate 103, wiring patterns 129a, 129b, 129d, and 29c are formed on a base substrate 28. In addition, a liquid crystal driving IC 21 is mounted substantially at the center of the flexible substrate 103, and electronic components (not shown), such as capacitors and ICs, are mounted thereon. The base substrate 28 is a flexible film, and the wiring patterns 129a, 129b, 129d, and 29c are made of, for example, copper.

Further, as shown in FIG. 9, the flexible substrate 103 has a substantially rectangular shape, and includes a portion 130 arranged adjacent to the second substrate 108, which is shown in the upper side of FIG. 9, and a portion 31 arranged opposite to the second substrate 108, which is shown in the lower side of FIG. 9. The portion 130 has a cut-out portion 32 having a 'U' shape that is provided closer to the liquid crystal panel than to the liquid crystal driving IC 21 substantially at the center thereof so as to pass through the base substrate. The portion 130 includes a second connecting portion 134 formed by a substantially rectangular region B surrounded by the cut-out portion 32 and a first connecting portion 133 formed by a region arranged outside the cut-out portion 32.

Furthermore, as shown in FIG. 10, a plurality of connecting terminals 136 electrically connected to the wiring pattern 129a is provided in the vicinity of the edge of the first connecting portion 133 that is formed by the region C surrounded by the cut-out portion 32. The connecting terminals 136 are electrically connected to the external connection terminals 124 of the liquid crystal panel 102 through an external connection ACF 37. In this way, it is possible to supply various signals related to display images from the flexible substrate 103 to the liquid crystal panel 102.

Further, as shown in FIGS. 9 to 11, the second connecting portion 134 is erected from the first connecting portion 133 around both ends of the cut-out portion 32 so as to be arranged on the surface of the second substrate 108 opposite to the liquid crystal (the surface opposite to the liquid crystal panel 102). Therefore, as shown in FIG. 11, the second connecting portion 134 is arranged on the externally protruding portion 35 of the second substrate 108 projecting from the polarizing plate 17.

Furthermore, as shown in FIG. 10, the flexible substrate 103 includes input terminals 23 and a plurality of output terminals 122 provided in a mounting region of the base substrate 28 corresponding to the a mounting surface of the liquid crystal driving IC 21. The output terminals 122 are electrically connected to the wiring pattern 129a, and the input terminals 23 are electrically connected to the wiring pattern 129d.

As shown in FIGS. 10 and 11, the illuminating device 104 includes a light source 139 for emitting light toward the liquid crystal panel 102, an optical waveguide 40 serving as an optical member for guiding the light emitted from the light source 139 to the liquid crystal panel 102, two prism sheets 41 and 42, a diffusing sheet 43, a reflective sheet 44, and an adhesive sheet 145 serving as an adhesive member for fixing the optical member to the liquid crystal panel 102.

For example, an LED is used as the light source 139. As shown in FIG. 11, one LED is mounted on a surface of the second connecting portion 34 opposite to the externally protruding portion 35 of the second substrate 108. Of course, the number of light sources 139 is not limited thereto. For example, two or more light sources may be used.

As shown in FIG. 10, a portion of the base substrate between the light source 139 and the edge of the second connecting portion 134 of the flexible substrate 103 is adhered to a light-source-side end portion of the prism sheet 41, serving as an optical member, which is arranged on the second substrate 108, by the adhesive sheet 145. In this way, as shown in FIG. 10, the light source 139 is accurately positioned on a light receiving surface of the optical waveguide 40, and thus light emitted from the light source can be properly incident on the optical waveguide 40.

Further, the adhesive sheet 145 is, for example, a double-sided adhesive tape having a substantially rectangular shape. As represented by a hatched region in FIG. 12, the adhesive sheet 145 is adhered to the polarizing plate 17 and a surface of the second connecting portion 134 of the flexible substrate 3 opposite to the externally protruding portion on the second substrate 108, with one adhesive surface thereof facing them.

As shown in FIG. 12, the edge of the adhesive sheet 145 is aligned with the edge of the second substrate 108, and a light-emitting opening 46 having a substantially rectangular shape for making light emitted from the prism sheet 41 incident on the polarizing plate 17 is formed in the adhesive sheet 145 at a position slightly leaning from the center toward an edge (an upper side in FIG. 12) thereof.

Further, a light source opening 147 is formed on the lower side of the light-emitting opening 46 to overlap the light source 139, as shown in FIG. 12, such that the light source 139 mounted on the second connecting portion 134 of the flexible substrate 103 can be accurately fitted thereinto.

Furthermore, the prism sheet 41, serving as an optical member, is adhered to a portion of the adhesive surface of the adhesive sheet 145 opposite to the liquid crystal panel 102, which corresponds to the polarizing plate 17, and an end surface of the frame 5 facing the second substrate is adhered to a portion of the adhesive surface of the adhesive sheet 145 positioned at the lower side of the light source opening 147 in FIG. 12.

However, in this embodiment, the second connecting portion 134 of the flexible substrate 103 is arranged on the surface of the second substrate 108 of the liquid crystal panel 102 opposite to the liquid crystal, but the invention is not limited to this structure. For example, the second connecting portion 134 may be only arranged on the externally protruding portion 35 so as not to be covered with the frame 105 and not to be interposed between members.

Manufacturing Method of Liquid Crystal Display Device

Next, a method of manufacturing the liquid crystal display device according to this embodiment is similar to that of the first embodiment except that the arrangement positions of the first and second connecting portions of the flexible substrate are reverse to those of the first embodiment. Therefore, the different point will be simply described.

First, as shown in FIGS. 10 and 11, a film made of copper is formed on the base substrate 28 by, for example, a sputtering method, and the wiring patterns 129a, 129b, and 129d, and 29c and a plurality of connecting terminals 136 are formed in a predetermined pattern by, for example, a photolithography method. At that time, the output terminals 122 electrically connected to the wiring pattern 129a and the input terminals 23 electrically connected to the wiring pattern 129d are simultaneously formed.

Further, the light source 139 is mounted on the second connecting portion 134 of the flexible substrate 103. Then, bumps 26 of the liquid crystal driving IC 21 are electrically connected to the output terminals 122 and the input terminals 23 with an ACF 27 interposed therebetween by thermal pressing, thereby mounting the liquid crystal driving IC 21 on the flexible substrate 103.

Then, the U-shaped cut-out portion 32 is formed substantially at the center (the upper part of the liquid crystal driving IC 21) of the flexible substrate 103, as shown in FIGS. 9 and 12, such that the light source 139 reaches the second connecting portion 134 surrounded by the cut-out portion 32. In this way, the first connecting portion 133 is formed by the region C arranged outside the cut-out portion 32, and the source 139 is arranged on the second connecting portion 134.

Subsequently, as shown in FIG. 11, the second connecting portion 134 of the flexible substrate 103 is erected from the first connecting portion 133 by using the cut-out portion 32, and is then placed on the surface of the externally protruding portion 35 opposite to the display surface of the liquid crystal panel 102. The external connection terminals 124 of the second substrate 108 of the liquid crystal panel 102 are electrically connected to the connecting terminals 136 formed on the first connecting portion 133 of the flexible substrate 103 through the external connection ACF 137 to connect the liquid crystal panel 102 and the flexible substrate 103.

In this way, as shown in FIG. 12, the second connecting portion 134 of the flexible substrate 103 is arranged on the externally protruding portion 35 such that the light source 139 mounted on the second connecting portion 134 is accurately disposed on the light receiving surface of the optical waveguide 40, and the adhesive sheet 145 is adhered to the second connecting portion 134 and the polarizing plate 17.

At that time, as shown in FIG. 12, the light-emitting opening 46 of the adhesive sheet 145 substantially corresponds to, an effective display region D of the liquid crystal panel 102, and the light source 139 is accurately fitted into the light source opening 147 of the adhesive sheet 145. In this way, the second connecting portion 134 of the flexible substrate 3 is fixed to a predetermined position where light emitted from the mounted light source 139 is accurately incident on the optical waveguide 40.

The subsequent manufacturing processes are the same as those in the first embodiment, and thus a description thereof will be omitted.

The assembly process of the flexible substrate 103, the liquid crystal panel 102, the illuminating device 104, and the frame 105 is completed in this way.

Then, for example, an external circuit is electrically connected through the connector 38, and then a case is attached, thereby completing the liquid crystal display device 101 serving as an electro-optical device.

As such, according to this embodiment, the first connecting portion 133 is formed by the region C arranged outside the cut-out portion 32 passing through the flexible substrate 103, and the second connecting portion 134 is formed by the region B surrounded by the cut-out portion 32 so that it can be erected from the first connecting portion 133. Therefore, it is possible to form the first connecting portion 133 to have a larger width than the second connecting portion 134, which makes it possible to cope with a case in which the width of the flexible substrate should increase for electrical connection between the terminals and the liquid crystal panel 102. As a result, the degree of freedom in the design of the liquid crystal display device 101 is improved.

First Modification

Next, a first modification of the liquid crystal display device according to the first embodiment of the invention will be described. The first modification is different from the first embodiment in that the cut-out portion is formed substantially in an 'L' shape, and thus a description centers on that point. In the first modification, the same components as those in the first embodiment have the same reference numerals, and a description thereof will be omitted.

Figure 13:
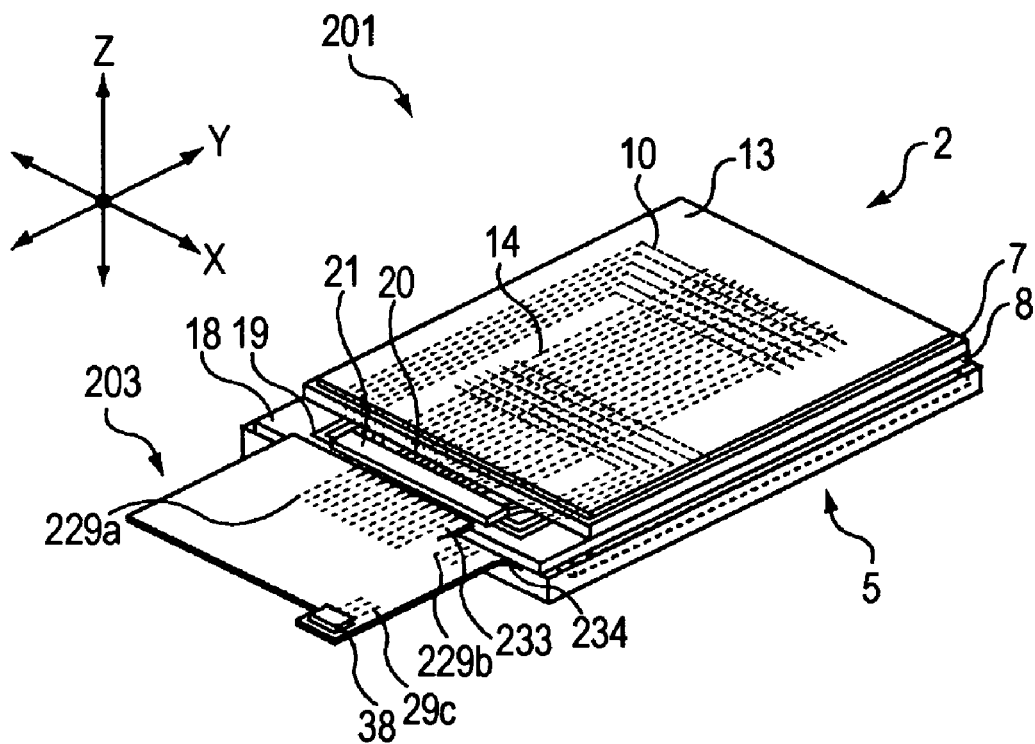
FIG. 13 is a perspective view schematically illustrating a liquid crystal display device according to a first modification.
Figure 14:
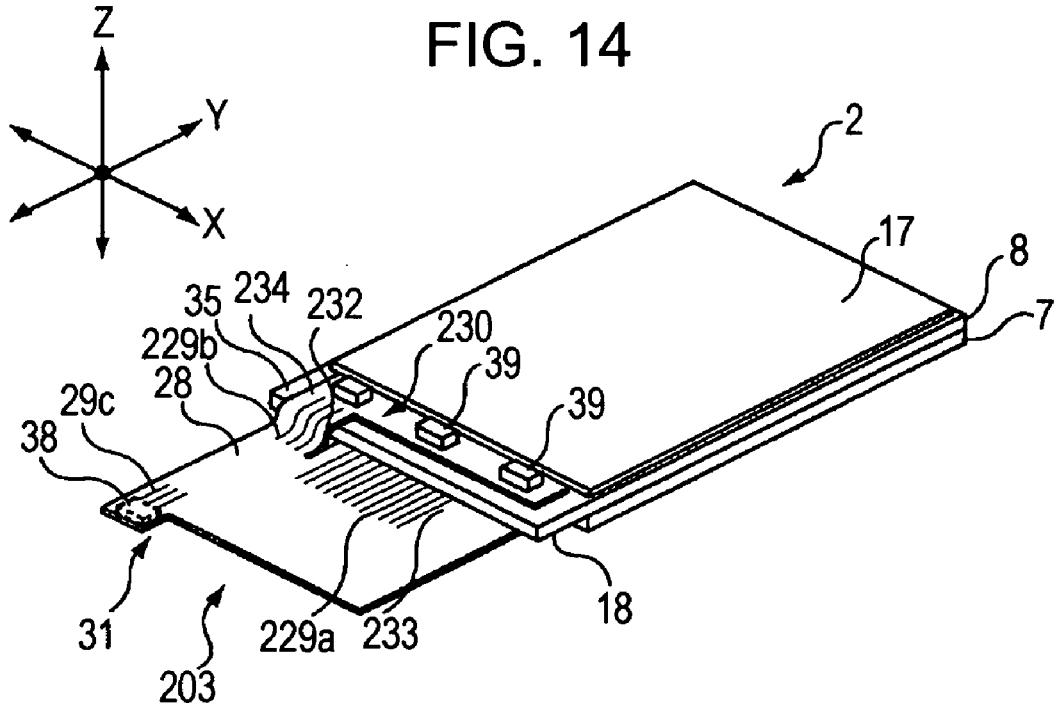
FIG. 14 is a bottom view schematically illustrating a liquid crystal panel and a flexible substrate according to the first modification.
Figure 15:
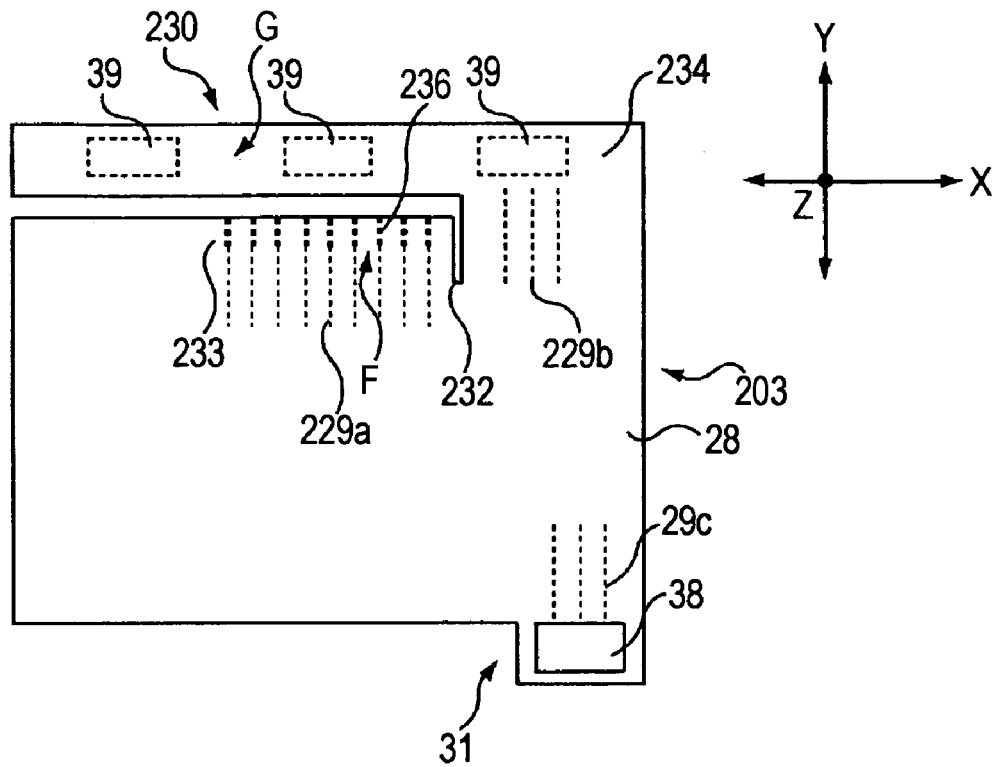
FIG. 15 is a plan view schematically illustrating the flexible substrate according to the first modification.

FIG. 13 is a perspective view schematically illustrating a liquid crystal display device according to the first modification. FIG. 14 is a schematic bottom view of a liquid crystal panel and a flexible substrate according to the first modification. FIG. 15 is a plan view schematically illustrating the flexible substrate according to the first modification.

Structure of Liquid Crystal Display Device

As shown in FIG. 13, a liquid crystal display device 201 includes, for example, a liquid crystal panel 2, a flexible substrate 203, serving as a base member, connected to the liquid crystal panel 2, an illuminating device 4 for emitting light to the liquid crystal panel 2, and a frame 5 for protecting the flexible substrate 203 and the illuminating device 4. In this structure, in addition to the frame 5, other components are additionally mounted to the liquid crystal display device 201, if necessary (not shown).

As shown in FIGS. 13 to 15, in the flexible substrate 203, wiring patterns 229a, 229b, and 29c are formed on a base substrate 28, and electronic components (not shown), such as capacitors and ICs, are mounted thereon. The base substrate 28 is a flexible film, and the wiring patterns 229a, 229b, and 29c are made of, for example, copper.

Further, as shown in FIG. 15, the flexible substrate 203 has a substantially rectangular shape, and includes a portion 230 arranged adjacent to a second substrate 8, which is shown in the upper side of FIG. 15, and a portion 31 arranged opposite to the second substrate 8, which is shown in the lower side of FIG. 15.

The portion 230 has an 'L'-shaped cut-out portion 232 formed by cutting out the base substrate from one side edge (the left side in FIG. 15) of the flexible substrate 203 toward the inside thereof and then by further cutting out it from the leading end of the cut-out portion toward the portion 31.

The portion 230 includes a first connecting portion 233 formed by a substantially rectangular region F surrounded by the cut-out portion 232 and a side edge of the flexible substrate 203 and a second connecting portion 234 formed by a region G arranged outside the first connecting portion 233 and the cut-out portion 232.

For example, as shown in FIGS. 13 to 15, the second connecting portion 234 is erected from the end of the cut-out portion 232 on the right side (as viewed from the connector 38 shown in FIG. 13) of the first connecting portion 233 and is then placed on a surface of the second substrate 8 of the liquid crystal panel 2 opposite to the liquid crystal (the side opposite to the display surface of the liquid crystal panel 2). That is, as shown in FIG. 14, the second connecting portion 234 is arranged on an externally projecting portion 35 of the second substrate 8 that projects from a polarizing plate 17.

Furthermore, as shown in FIG. 15, a plurality of connecting terminals 236 electrically connected to the wiring pattern 229a is provided in the vicinity of the edge, facing the liquid crystal panel, of the first connecting portion 233 surrounded by the cut-out portion 232. The connecting terminals 236 are electrically connected to external connection terminals 24 of the liquid crystal panel 2 through an external connection ACF 37. In this way, it is possible to supply various signals related to display images from the flexible substrate 203 to a liquid crystal driving IC 21 through input wiring lines 25.

However, in this modification, the second connecting portion 234 of the flexible substrate 203 is arranged on the surface of the second substrate 8 of the liquid crystal panel 2 opposite to the liquid crystal, but the invention is not limited to this structure. For example, the second connecting portion 234 may be only arranged on the externally protruding portion 35 so as not to be covered with the frame 5 and not to be interposed between members.

Manufacturing Method of Liquid Crystal Display Device

Next, a method of manufacturing the liquid crystal display device according to this modification is similar to that of the first embodiment. However, since this modification is different from the first embodiment in that the cut-out portion is formed substantially in an 'L' shape, the different point will be simply described.

As shown in FIG. 15, a film made of copper is formed on the base substrate 28 by, for example, a sputtering method, and the wiring patterns 229a, 229b, and 29c and a plurality of connecting terminals 236 are formed by, for example, a photolithography method. In addition, three light sources 39 are mounted on the surface of the second connecting portion 234 of the flexible substrate 203 so as to be separated from each other at predetermined intervals.

Then, as shown in FIG. 15, the 'L'-shaped cut-out portion 232 is formed to pass through the flexible substrate 203 by cutting out the flexible substrate 203 from one side edge (the left side in FIG. 15) thereof toward the inside and then by further cutting out it from the leading end of the cut-out portion toward the portion 31. At that time, the cut-out portion 232 is formed such that the connecting terminals 236 are placed at the edge of the first connecting portion 233 surrounded by the cut-out portion 232. In this way, the second connecting portion 234 is formed by the region G arranged outside the cut-out portion 232, and the three light sources 39 are arranged on the second connecting portion 234.

The subsequent manufacturing processes are the same as those in the first embodiment, and thus a description thereof will be omitted.

The assembly process of the flexible substrate 203, the liquid crystal panel 2, the illuminating device 4, and the frame 5 is completed in this way.

Then, for example, an external circuit is electrically connected through the connector 38, and then a case is attached, thereby completing the liquid crystal display device 201 serving as an electro-optical device.

As such, according to this modification, the cut-out portion 232 is formed substantially in an 'L' shape by cutting out the flexible substrate 203 from one side edge thereof toward the inside and then by further cutting out it from the leading end of the cut-out portion toward the portion 31. Therefore, the first connecting portion 233 is formed closer to the liquid crystal panel, which makes it possible to reduce the size and thickness of a liquid crystal display device.

Second Modification

Next, a second modification of the liquid crystal display device according to the first embodiment of the invention will be described. The second modification is different from the first embodiment in that first connecting portions each are formed by a cut-out portion formed by cutting out an edge portion of a flexible substrate facing the liquid crystal panel, and thus a description centers on that point. In the second modification, the same components as those in the first embodiment have the same reference numerals, and a description thereof will be omitted.

Figure 16:
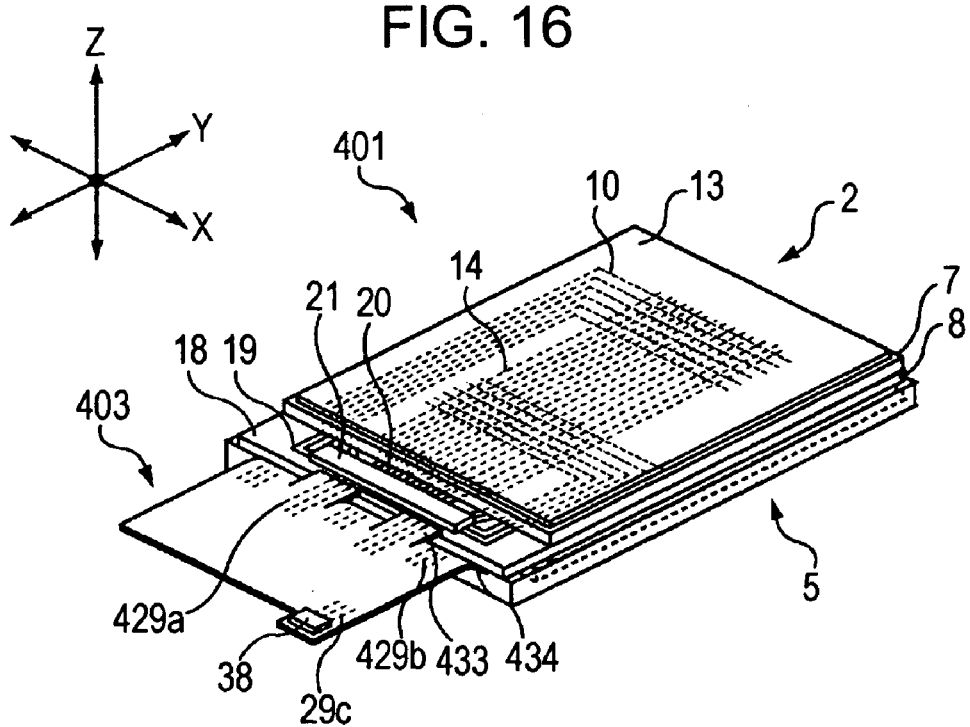
FIG. 16 is a perspective view schematically illustrating a liquid crystal display device according to a second modification.
Figure 17:
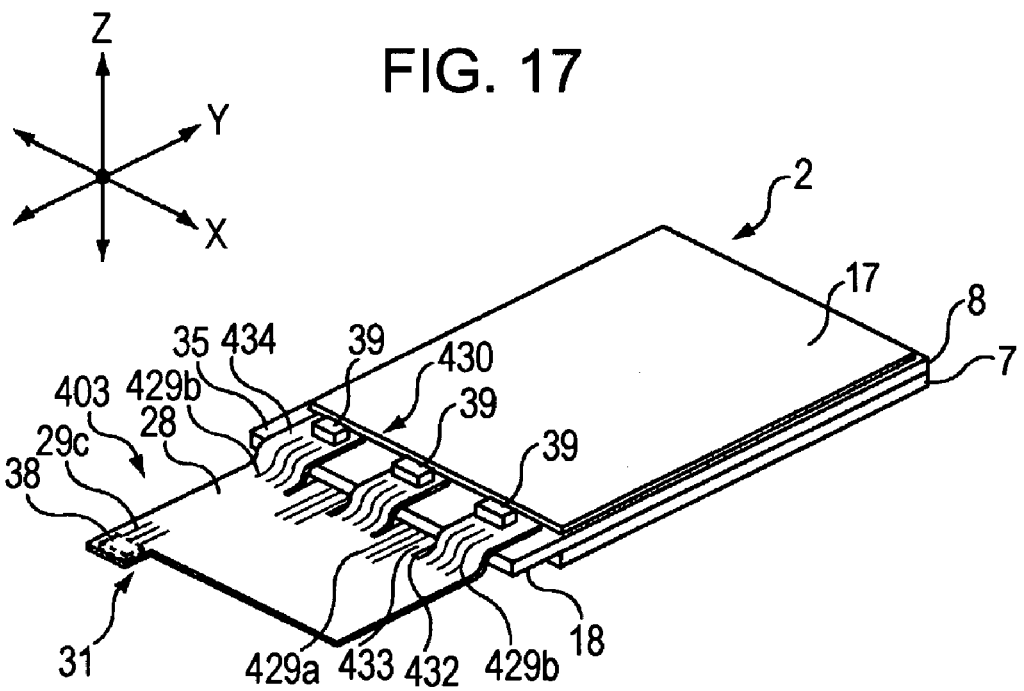
FIG. 17 is a bottom view schematically illustrating a liquid crystal panel and a flexible substrate according to the second modification.
Figure 18:
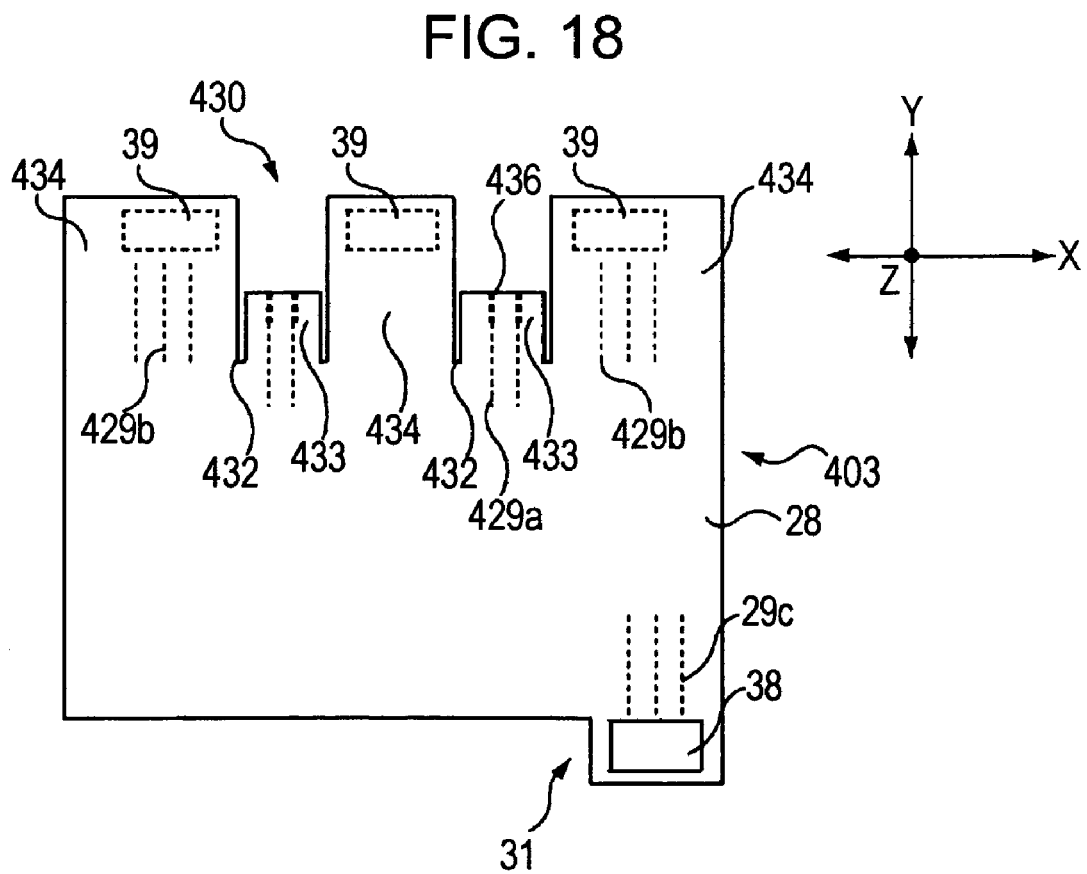
FIG. 18 is a plan view schematically illustrating the flexible substrate according to the second modification.

FIG. 16 is a perspective view schematically illustrating a liquid crystal display device according to the second modification. FIG. 17 is a schematic bottom view of a liquid crystal panel and a flexible substrate according to the second modification. FIG. 18 is a plan view schematically illustrating the flexible substrate according to the second modification.

Structure of Liquid Crystal Display Device

As shown in FIG. 16, a liquid crystal display device 401 includes, for example, a liquid crystal panel 2, a flexible substrate 403, serving as a base member, connected to the liquid crystal panel 2, an illuminating device 4 for emitting light to the liquid crystal panel 2, and a frame 5 for protecting the flexible substrate 403 and the illuminating device 4. In this structure, in addition to the frame 5, other components are additionally mounted to the liquid crystal display device 401, if necessary (not shown).

As shown in FIGS. 16 to 18, in the flexible substrate 403, wiring patterns 429a, 429b, and 29c are formed on a base substrate 28, and electronic components, such as capacitors and ICs, are mounted thereon. The base substrate 28 is a flexible film, and the wiring patterns 429a, 429b, and 29c are made of, for example, copper.

Further, as shown in FIG. 18, the flexible substrate 403 has a substantially rectangular shape, and includes a portion 430 arranged adjacent to a second substrate 8, which is shown in the upper side of FIG. 18, and a portion 31 arranged opposite to the second substrate 8, which is shown in the lower side of FIG. 18.

Further, as shown in FIG. 18, the portion 430 includes cut-out portions 432 having substantially linear shapes that are continuously formed in the edge of the portion 430 by cutting out the flexible substrate 403.

Furthermore, as shown in FIG. 18, the portion 430 includes first connecting portions 433 formed in rectangular shapes by the cut-out portions 432 and rectangular second connecting portions 434 protruding from the first connecting portions 433.

As shown in FIGS. 16 and 17, the second connecting portions 434 are erected from root portions of the cut-out portions 432 on the right and left sides of each of the first connecting portions 433 and are then placed on a surface of the second substrate 8 of the liquid crystal panel 2 opposite to the liquid crystal (the side opposite to the display surface of the liquid crystal panel 2). That is, as shown in FIG. 17, the second connecting portions 434 are arranged on an externally projecting portion 35 of the second substrate 8 that projects from a polarizing plate 17.

Furthermore, as shown in FIGS. 16 to 18, a plurality of connecting terminals 436 electrically connected to the wiring pattern 429a is provided in the vicinity of the edge, facing the liquid crystal panel, of each first connecting portion 433 formed by the region surrounded by the cut-out portion 432. The connecting terminals 436 are electrically connected to external connection terminals 24 of the liquid crystal panel 2 through an external connection ACF 37. In this way, it is possible to supply various signals related to display images from the flexible substrate 403 to a liquid crystal driving IC 21 through input wiring lines 25.

However, in this modification, the second connecting portions 434 of the flexible substrate 403 are arranged on the surface of the second substrate 8 of the liquid crystal panel 2 opposite to the liquid crystal, but the invention is not limited to this structure. For example, the second connecting portions 434 may be only arranged on the externally protruding portion 35 so as not to be covered with the frame 5 and not to be interposed between members.

Manufacturing Method of Liquid Crystal Display Device

Next, a method of manufacturing the liquid crystal display device according to this modification is similar to that of the first embodiment. However, since this modification is different from the first embodiment in that the first connecting portions are formed by the cut-out portions formed by cutting out the edge of the flexible substrate facing the second substrate, the different point will be simply described.

As shown in FIG. 18, a film made of copper is formed on the base substrate 28 by, for example, a sputtering method, and the wiring patterns 429a, 429b, and 29c and a plurality of connecting terminals 436 are formed by, for example, a photolithography method. In addition, three light sources 39 are respectively mounted on the surfaces of the second connecting portions 434 of the flexible substrate 403 separated from each other at predetermined intervals. Further, a connector 38 is mounted on a protruding part of the portion 31 of the flexible substrate 403 so as to be electrically connected to the wiring pattern 29c.

Then, as shown in FIG. 18, the first and second rectangular connecting portions 433 and 434 are formed by the cut-out portions 432 formed by cutting out the edge of the portion 430 of the flexible substrate 403 substantially in linear shapes. In this case, the connecting terminals 436 are arranged at the edge of each first connecting portion 433 interposed between the cut-out portions 432, and the second connecting portions 434 protrude from the first connecting portions 433. In this way, the three light sources 39 are respectively arranged on the second rectangular connecting portions 434 having a larger length, and the connecting terminals 436 are formed at the edges of the first rectangular connecting portions 433 having a smaller length that are formed between the second connecting portions 434.

The subsequent manufacturing processes are the same as those in the first embodiment, and thus a description thereof will be omitted.

The assembly process of the flexible substrate 403, the liquid crystal panel 2, the illuminating device 4, and the frame 5 is completed in this way.

Then, for example, an external circuit is electrically connected through the connector 38, and then a case is attached, thereby completing the liquid crystal display device 401 serving as an electro-optical device.

As such, according to this modification, the first connecting portions 433 are formed by the cut-out portions 432 continuously formed in the portion 430 of the flexible substrate 403. Therefore, a plurality of rectangular portions having different lengths can be formed in the portion 430 by forming the cut-out portions to extend toward the inside of the flexible substrate 403, and the rectangular portions can be used as the first and second connecting portions. Therefore, it is possible to arrange the first connecting portions 433 and the second connecting portions 434 on different surfaces, without bending the flexible substrate 403.

Further, these first and second connecting portions 433 and 434 makes it possible to improve the degree of freedom in forming the flexible substrate 403, and to arrange the flexible substrate on the substrates of various types of liquid crystal panels.

Third Modification

Next, a third modification of the liquid crystal display device according to the first embodiment of the invention will be described. The third modification is different from the first embodiment in that a first connecting portion is formed by a cut-out portion formed in a side of a flexible substrate facing a liquid crystal panel, and thus a description centers on that point. In the third modification, the same components as those in the first embodiment have the same reference numerals, and a description thereof will be omitted.

Figure 19:
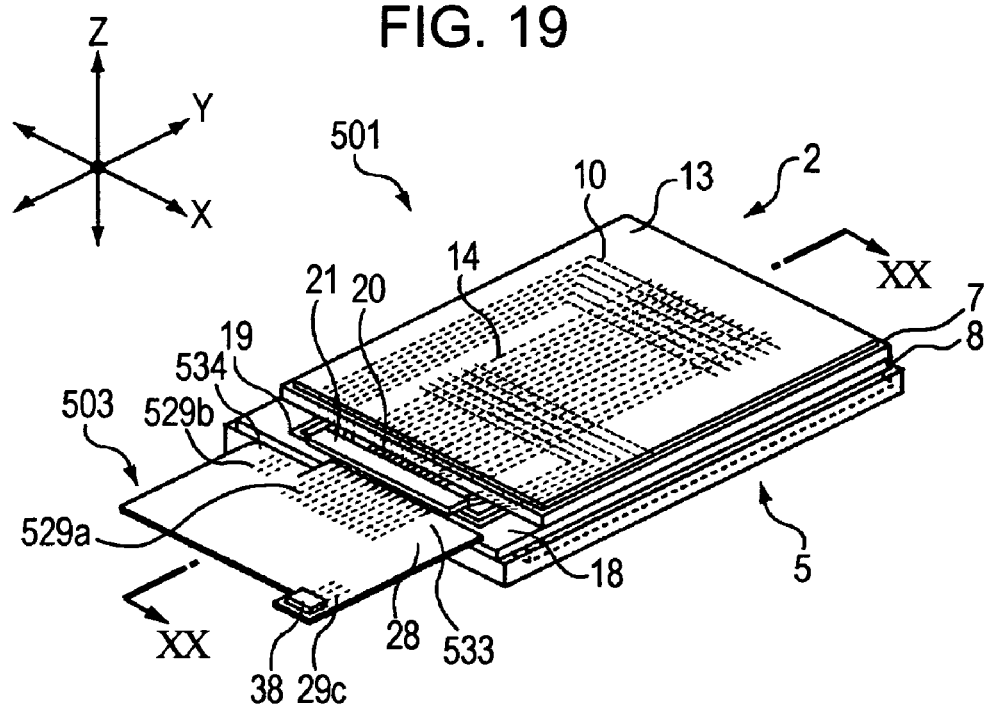
FIG. 19 is a perspective view schematically illustrating a liquid crystal display device according to a third modification.
Figure 20:
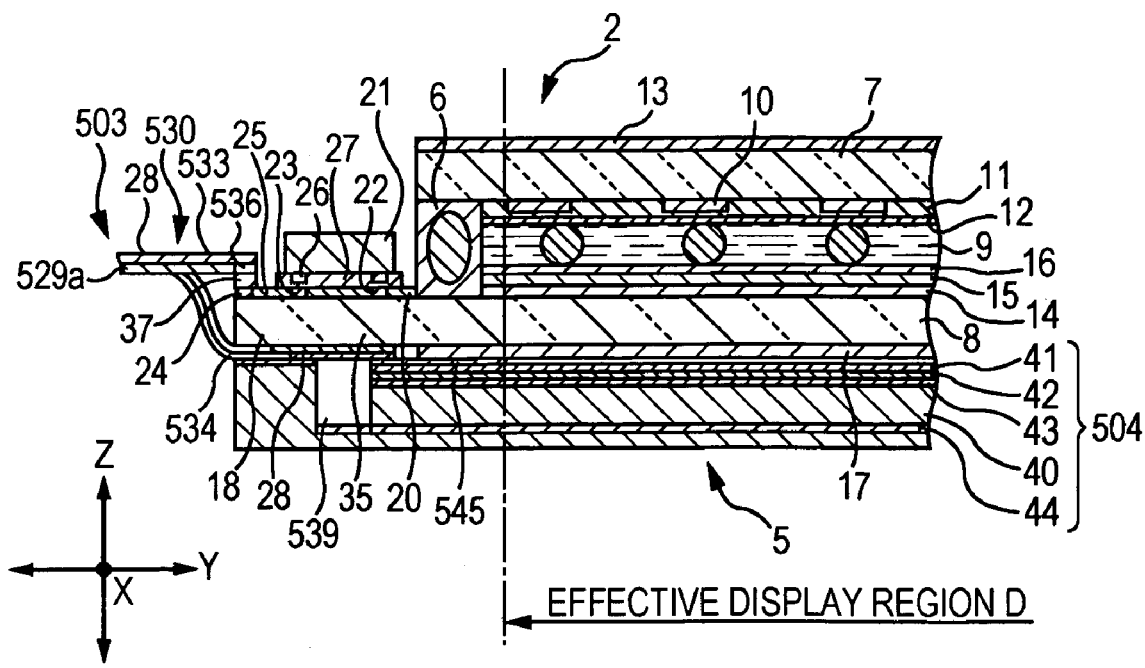
FIG. 20 is a cross-sectional view taken along the line XX-XX of FIG. 19 (a liquid crystal driving IC and a light source are not cut).
Figure 21:
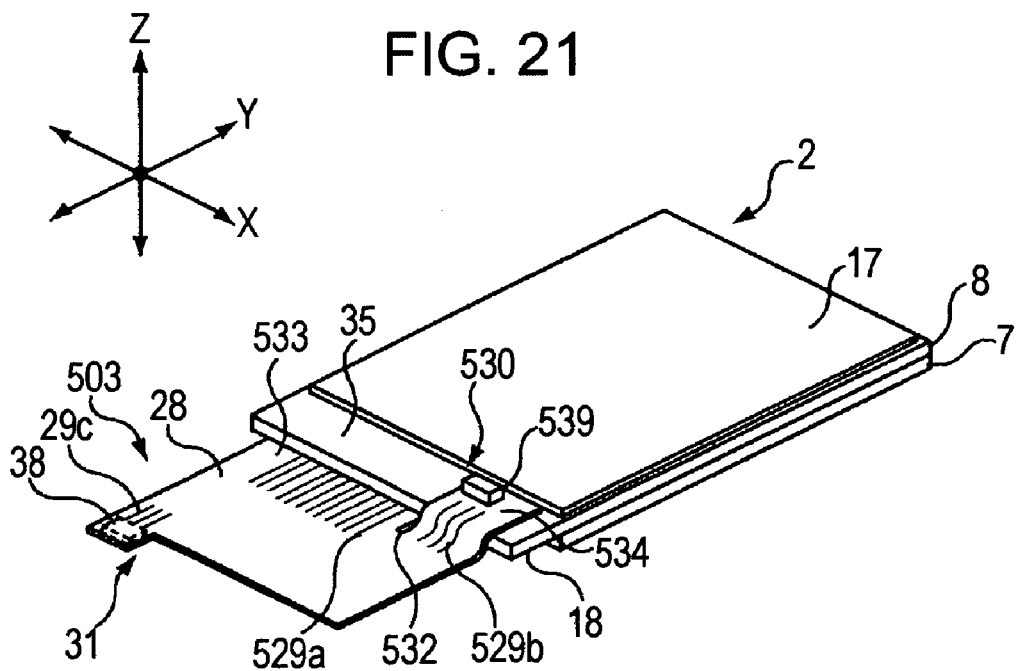
FIG. 21 is a bottom view schematically illustrating a liquid crystal panel and a flexible substrate according to the third modification.
Figure 22:
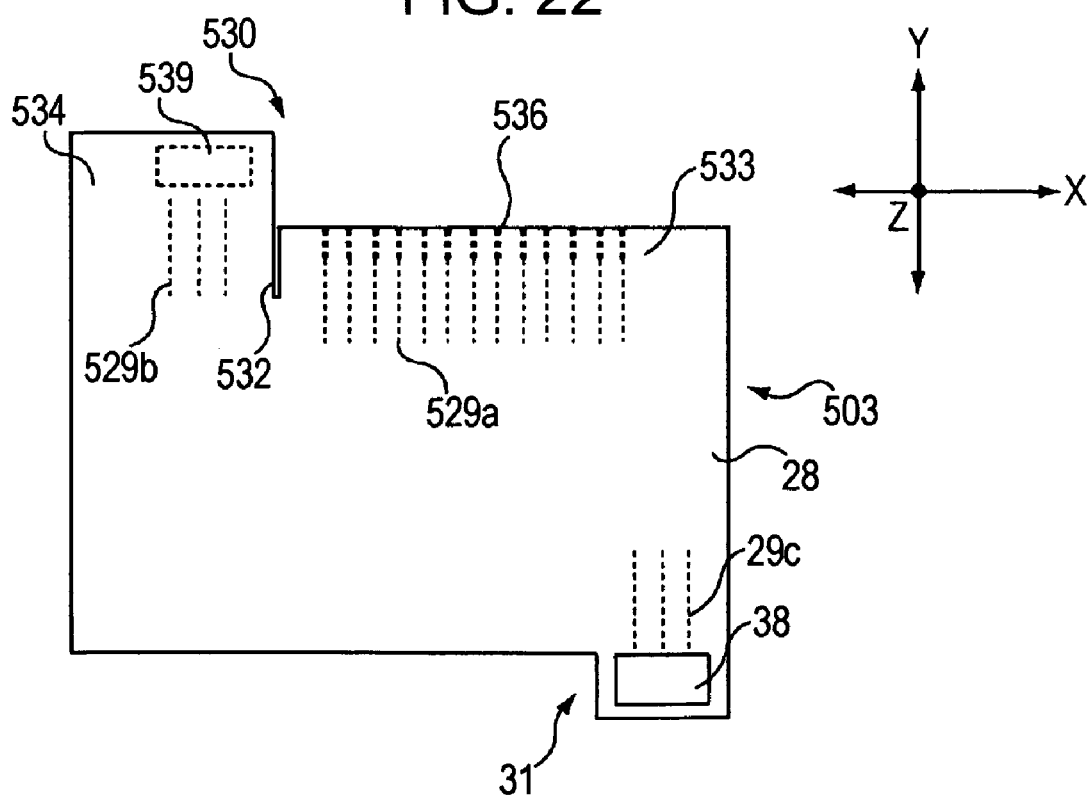
FIG. 22 is a plan view schematically illustrating the flexible substrate according to the third modification.
Figure 23:
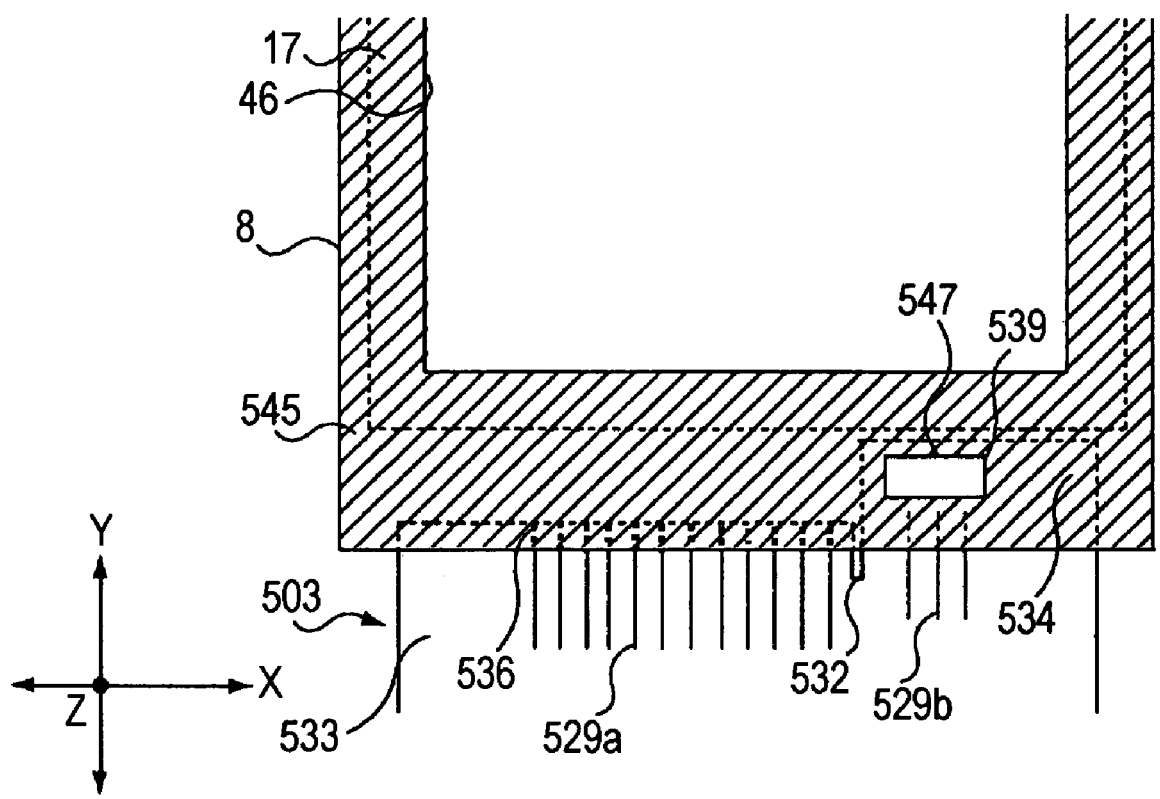
FIG. 23 is a view illustrating the bonded state of an adhesive sheet according to the third modification.

FIG. 19 is a perspective view schematically illustrating a liquid crystal display device according to the third modification. FIG. 20 is a cross-sectional view taken along the line XX-XX of FIG. 19 (a liquid crystal driving IC and a light source are not cut). FIG. 21 is a schematic bottom view of a liquid crystal panel and a flexible substrate according to the third modification. FIG. 22 is a plan view schematically illustrating the flexible substrate according to the third modification. FIG. 23 is a view illustrating the bonded state of an adhesive sheet.

Structure of Liquid Crystal Display Device

As shown in FIG. 19, a liquid crystal display device 501 includes, for example, a liquid crystal panel 2, a flexible substrate 503, serving as a base member, connected to the liquid crystal panel 2, an illuminating device 504 for emitting light to the liquid crystal panel 2, and a frame 5 for protecting the flexible substrate 503 and the illuminating device 504. In this structure, in addition to the frame 5, other components are additionally mounted to the liquid crystal display device 501, if necessary (not shown).

As shown in FIGS. 19 to 21, in the flexible substrate 503, wiring patterns 529a, 529b, and 29c are formed on a base substrate 28, and electronic components, such as capacitors and ICs, are mounted thereon. The base substrate 28 is a flexible film, and the wiring patterns 529a, 529b, and 29c are made of, for example, copper.

Further, as shown in FIG. 21, the flexible substrate 503 has a substantially rectangular shape, and includes a portion 530 arranged adjacent to a second substrate 8, which is shown in the upper side of FIG. 22, and a portion 31 arranged opposite to the second substrate 8, which is shown in the lower side of FIG. 22.

As shown in FIG. 22, the portion 530 has a cut-out portion 532 formed substantially in a linear shape at the edge of the portion 530 of the flexible substrate 503.

As shown in FIG. 22, the portion 530 includes a first connecting portion 533 and a second connecting portion 534 protruding from the first connecting portion 533, which are formed in rectangular shapes by the cut-out portion 532.

For example, as shown in FIGS. 20 to 22, the second connecting portion 534 is erected from a root portion of the cut-out portion 532 on the left side (as viewed from a connector 38 shown in FIG. 19) of the first connecting portion 533 and is then arranged on a surface of the second substrate 8 of the liquid crystal panel 2 opposite to liquid crystal (the side opposite to the display surface of the liquid crystal panel 2). That is, as shown in FIGS. 20 and 21, the second connecting portion 534 is arranged on an externally projecting portion 35 of the second substrate 8 that projects from a polarizing plate 17.

Furthermore, as shown in FIGS. 19, 21, and 22, a plurality of connecting terminals 536 electrically connected to the wiring pattern 529a is provided in the vicinity of the edge, facing the liquid crystal panel, of the first connecting portion 533 formed on the right side of the cut-out portion 532 in FIG. 22. The connecting terminals 536 are electrically connected to external connection terminals 24 of the liquid crystal panel 2 through an external connection ACF 37. In this way, it is possible to supply various signals related to display images from the flexible substrate 503 to a liquid crystal driving IC 21 through input wiring lines 25.

Furthermore, as shown in FIGS. 20 to 22, the illuminating device 504 includes a light source 539 for emitting light toward the liquid crystal panel 2, an optical waveguide 40 serving as an optical member for guiding the light emitted from the light source 539 to the liquid crystal panel 2, two prism sheets 41 and 42, a diffusing sheet 43, a reflective sheet 44, and an adhesive sheet 545 serving as an adhesive member for fixing the optical member to the liquid crystal panel 2.

For example, an LED is used as the light source 539. As shown in FIG. 21, the light source 539 is mounted on a surface of the second rectangular connecting portion 534 opposite to an externally protruding portion of the second substrate 8.

As shown in FIG. 20, a portion of the base substrate between the light source 539 and the edge of the second connecting portion 534 of the flexible substrate 503 is adhered to a light-source-side end portion of the prism sheet 41, serving as an optical member, which is arranged on the second substrate 8, by the adhesive sheet 545. In this way, as shown in FIG. 20, the light source 539 is accurately positioned on a light receiving surface of the optical waveguide 40, and thus light emitted from the light source can be properly incident on the optical waveguide 40.

In addition, the adhesive sheet 545 is, for example, a double-sided adhesive tape having a substantially rectangular shape. As represented by a hatched region in FIG. 23, the adhesive sheet 545 is adhered to the polarizing plate 17 and a surface of the second connecting portion 534 of the flexible substrate 503 opposite to the externally protruding portion 35 on the second substrate 8, with one adhesive surface thereof facing them.

As shown in FIG. 23, the edge of the adhesive sheet 545 is aligned with the edge of the second substrate 8, and a light-emitting opening 46 having a substantially rectangular shape for making light emitted from the prism sheet 41 incident on the polarizing plate 17 is formed in the adhesive sheet 545 at a position slightly leaning from the center toward an edge (an upper side in FIG. 23) thereof.

Further, a light source opening 547 is formed in the adhesive sheet 545 on the lower side of the light-emitting opening 46 to overlap the light source 539, as shown in FIG. 23, such that the light source 539 mounted on the second connecting portion 534 of the flexible substrate 3 can be accurately fitted thereinto.

Furthermore, the prism sheet 41, serving as an optical member, is adhered to a portion of the adhesive surface of the adhesive sheet 545 opposite to the liquid crystal panel 2, which corresponds to the polarizing plate 17, and an end surface of the frame 5 facing the second substrate is adhered to a portion of the adhesive surface of the adhesive sheet 545 positioned at the lower side of the light source opening 47 in FIG. 23.

In this modification, the second connecting portion 534 of the flexible substrate 503 is arranged on the surface of the second substrate 8 of the liquid crystal panel 2 opposite to the liquid crystal, but the invention is not limited thereto. For example, the second connecting portion 534 may be only arranged on the externally protruding portion 35 so as not to be covered with the frame 5 and not to be interposed between members.

Manufacturing Method of Liquid Crystal Display Device

Next, a method of manufacturing the liquid crystal display device according to this modification is similar to that of the first embodiment. However, since this modification is different from the first embodiment in that one first connecting portion is formed by the cut-out portion formed in the edge of the flexible substrate facing the second substrate, the different point will be simply described.

As shown in FIG. 22, a film made of copper is formed on the base substrate 28 by, for example, a sputtering method, and the wiring patterns 529a, 529b, and 29c and a plurality of connecting terminals 536 are formed in a predetermined pattern by, for example, a photolithography method. In addition, the light source 39 is mounted on the second connecting portion 534 of the flexible substrate 503.

As shown in FIG. 22, the cut-out portion 532 is formed substantially in a linear shape in the edge of the portion 530 of the flexible substrate 503 so as to pass through the flexible substrate 503. Then, as shown in FIG. 22, the first connecting portion 533 and the second connecting portion 534 protruding from the first connecting portion 533 are formed in rectangular shapes by the cut-out portion 532. In addition, as shown in FIG. 22, the connecting terminals 536 electrically connected to the wiring pattern 529a are arranged in the vicinity of the edge of the first connecting portion 533 facing the liquid crystal panel, and the light source 539 is arranged on the second connecting portion 534.

Thereafter, as shown in FIGS. 19 to 21, the second connecting portion 534 is erected from a root portion of the cut-out portion 532 on the left side of the first connecting portion 533 and is then arranged on a surface of the second substrate 8 of the liquid crystal panel 2 opposite to liquid crystal (the side opposite to the display surface of the liquid crystal panel 2). That is, as shown in FIGS. 20 and 21, the second connecting portion 534 is arranged on an externally projecting portion 35 of the second substrate 8 that projects from a polarizing plate 17.

Further, the connecting terminals 536 formed in the vicinity of the edge of the first connecting portion 533, positioned on the right side of the cut-out portion 532 in FIG. 22, are electrically connected to the external connection terminals 24 of the liquid crystal panel 2 through the external connection ACF 37. In this way, it is possible to supply various signals related to display images from the flexible substrate 503 to a liquid crystal driving IC 21 through input wiring lines 25.

Furthermore, as shown in FIGS. 20 and 21, the second connecting portion 534 of the flexible substrate 503 is arranged on the externally protruding portion 35 such that the light source 539 mounted on the second connecting portion 534 is accurately disposed on the light receiving surface of the optical waveguide 40, and the adhesive sheet 545 is adhered on the second connecting portion 534 and the polarizing plate 17.

At that time, as shown in FIG. 23, the light-emitting opening 46 of the adhesive sheet 545 is arranged to substantially correspond to an effective display region D of the liquid crystal panel 2, and the light source 539 is accurately fitted into the light source opening 547 of the adhesive sheet 545. In this way, the second connecting portion 534 of the flexible substrate 503 is fixed to a predetermined position where light emitted from the mounted light source 539 is accurately incident on the optical waveguide 40.

The subsequent manufacturing processes are the same as those in the first embodiment, and thus a description thereof will be omitted.

The assembly process of the flexible substrate 503, the liquid crystal panel 2, the illuminating device 504, and the frame 5 is completed in this way.

Then, for example, an external circuit is electrically connected through the connector 38, and then a case is attached, thereby completing the liquid crystal display device 501 serving as an electro-optical device.

As such, according to this modification, since the cut-out portion 532 is formed in the portion 530 so as to pass through the flexible substrate 503, the second connecting portion 534 is formed in the portion 530, and the first connecting portion 533 is formed with a larger width. Therefore, the first connecting portion 533 and the second connecting portion 534 can be formed in different surfaces, without bending the flexible substrate 503. In addition, even when the liquid crystal panel has a large number of external connection terminals 24, pitches between the terminals can be widened, which makes it possible to cope with various types of liquid crystal display devices.

Third Embodiment/Electronic Apparatus

Next, an electronic apparatus having the above-mentioned liquid crystal display device 1, 101, 201, 401, or 501 according to a third embodiment of the invention will be described below. In this embodiment, the same components as those in the first embodiment have the same reference numerals, and a description thereof will be omitted.

FIG. 24 is a block diagram schematically illustrating the overall structure of a display control system of the electronic apparatus according to the third embodiment.

As shown in FIG. 24, an electronic apparatus 300 includes, as a display control system, the liquid crystal panel 2 and a display control unit 390. The display control unit 390 includes a display information output source 391, a display information processing circuit 392, a power supply circuit 393, and a timing generator 394.

The liquid crystal panel 2 includes a driving circuit 361 for driving a display region L.

The display information output source 391 has a memory composed of a ROM (read only memory) or a RAM (random access memory), a storage unit composed of, for example, a magnetic recording disk or an optical recording disk, and a tuning circuit for tuning and outputting digital image signals. The display information output source 391 supplies display information to the display information processing circuit 392 in the form of image signals having a predetermined format, on the basis of various clock signals generated by the timing generator 394.

The display information processing circuit 392 includes various well-known circuits, such as a serial-parallel conversion circuit, an amplification/inversion circuit, a rotation circuit, a gamma correction circuit, and a clamp circuit. The display information processing circuit 392 processes input display information to supply the processed image information to the driving circuit 361 together with a clock signal CLK. The power supply circuit 393 supplies a predetermined voltage to the above-mentioned components.

According to this embodiment, the flexible substrate 3, serving as a base member of the liquid crystal display device 1 used for the electronic apparatus 300, includes the first connecting portion 33 arranged on the protruding portion 18, which is a portion of one surface of the second substrate 8, and the second connecting portion 34 arranged on the externally protruding portion 35, which is a portion of the other surface of the second substrate 8. Therefore, the first connecting portion 33 can be electrically connected to the liquid crystal driving IC 21, and the light source 39 can be mounted on the second connecting portion 34, without bending the flexible substrate 3. Thus, the liquid crystal display device 1 having the above-mentioned structure makes it possible to reduce the size and thickness of the electronic apparatus 300.

In recent years, since electronic apparatuses having small size and thickness have been strongly demanded, the invention capable of meeting the demand has great significance.

The electronic apparatuses of the invention include a cellular phone, a personal computer, a touch panel, a liquid crystal television, a view-finder-type/monitor-direct-view-type videotape recorder, a car navigation apparatus, a pager, an electronic organizer, an electronic calculator, a word processor, a workstation, a television phone, and a POS terminal which are equipped with the liquid crystal display device. The above-mentioned liquid crystal display devices 1, 101, 201, 401, and 501 can be applied to display units of these electronic apparatuses.

Further, the electro-optical device and the electronic apparatus of the invention is not limited to the above-described examples, but various modifications and changes of the invention can be made without departing from the scope and spirit of the invention. In addition, combinations of the embodiments and the modifications can be made without departing from the scope and spirit of the invention.

The preferred embodiments of the invention have been described above, but the invention is not limited thereto. Various changes and modifications of the invention can be made in the technical scope of the invention.

In the above-mentioned embodiments, the passive matrix liquid crystal display device has been described, but the invention is not limited thereto. For example, an active matrix liquid crystal display device having thin film transistors as switching elements can be used, and an active matrix liquid crystal display device having thin film diodes as switching elements can be used. In addition, the invention may be applied to a transmissive liquid crystal display device as well as a transflective liquid crystal display device. In this way, it is possible to reduce the sizes and thicknesses of various types of liquid crystal display devices, and to decrease the number of components, which makes it possible to reduce manufacturing costs.

In the above-mentioned embodiments, the flexible substrate, serving as a base member, is connected to the liquid crystal panel, but the invention is not limited thereto. For example, TAB may be connected to the liquid crystal panel. In this case, it is possible to reduce the sizes and thicknesses of various types of liquid crystal display devices, and to decrease the number of components, which makes it possible to reduce manufacturing costs.

What is claimed is:

1. An electro-optical device comprising:
    a substrate including a first surface with terminals and a second surface opposite the first surface;
    a driving IC disposed on the first surface of the substrate and electrically connected to the terminals;
    a flexible substrate that is connected to the substrate, the flexible substrate including:
    a first connecting portion including an edge and terminals aligned along the edge, the terminals being connected to the terminals of the substrate through an anisotropic conductive film (ACF) and electrically connected to the driving IC; and
    a second connecting portion that directly confronts the second surface of the substrate, the second connecting portion extending along the second surface of the substrate from a position adjacent one edge of the substrate toward an opposite edge of the substrate so as to follow the edge of the first connecting portion along which the terminals are aligned; and
    light sources disposed on the second connecting portion and overlapping the driving IC with the substrate disposed therebetween.

2. The electro-optical device according to claim 1,
    wherein the second connecting portion protrudes beyond the first connecting portion toward the substrate.

3. The electro-optical device according to claim 1,
    wherein the first connecting portion is formed in a region surrounded by a cut-out portion passing through the flexible substrate or a region surrounded by the cut-out portion and a second edge of the flexible substrate, and
    the second connecting portion is formed in a region arranged near the first edge than the first connecting portion, with the cut-out portion therebetween.

4. The electro-optical device according to claim 3,
    wherein the cut-out portion is formed substantially in a 'U' shape.

5. The electro-optical device according to claim 3,
    wherein the cut-out portion is formed substantially in an 'L' shape formed by cutting out the flexible substrate from the second edge in board and then by further cutting out the flexible substrate in a direction away from the substrate.

6. The electro-optical device according to claim 1, further comprising:
    a third connecting portion,
    wherein the first connecting portion, the second connecting portion and the third connecting portion are formed by cut-out portions cut through the first edge of the flexible substrate.

7. The electro-optical device according to claim 1,
    wherein the first connecting portion is formed in a region arranged near the first edge than the first connecting portion, with a cut-out portion passing through the flexible substrate therebetween, and
    the second connecting portion is formed in a region surrounded by the cut-out portion.

8. The electro-optical device according to claim 1,
    wherein an external connection portion for electrical connection to an external device is provided at a third edge of the flexible substrate opposite to the first edge.

9. The electro-optical device according to claim 1,
    wherein a light source is provided in the second connecting portion.

10. The electro-optical device according to claim 9, further comprising:
    an optical member that guides light emitted from the light source to the substrate,
    wherein the second connecting portion is adhered to a surface of the optical member facing the substrate such that the light from the light source is emitted to the optical member.

11. The electro-optical device according to claim 10, further comprising:
    an adhesive sheet that is provided between the substrate and the optical member to adhere the optical member to the substrate,
    wherein the second connecting portion is adhered to the optical member by the adhesive sheet.

12. The electro-optical device according to claim 10, further comprising:
    a frame that protects the optical member,
    wherein the light source comes into contact with a portion of the frame.

13. An electronic apparatus comprising the electro-optical device according to claim 1.

* * * * *